US007729195B2

(12) United States Patent  
Youn et al.

(10) Patent No.: US 7,729,195 B2  
(45) Date of Patent: Jun. 1, 2010

(54) SEMICONDUCTOR MEMORY DEVICE HAVING SPLIT WORD LINE DRIVER CIRCUIT WITH LAYOUT PATTERNS THAT PROVIDE INCREASED INTEGRATION DENSITY

(75) Inventors: Jae-Youn Youn, Seoul (KR); Yoon-Hwan Yoon, Yongin-si (KR); Sang-Jae Rhee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 211 days.

(21) Appl. No.: 11/935,887

(22) Filed: Nov. 6, 2007

(65) Prior Publication Data

US 2008/0112253 A1 May 15, 2008

(30) Foreign Application Priority Data

Nov. 9, 2006 (KR) .................... 10-2006-00110329

(51) Int. Cl.  
 *G11C 8/00* (2006.01)
(52) U.S. Cl. ........................... 365/230.06; 365/230.03; 365/207; 365/208; 365/51
(58) Field of Classification Search ............ 365/230.06, 365/208, 207, 149, 63, 51, 185.23, 185.13, 365/230.03, 230.08  
See application file for complete search history.

(56) References Cited

U.S. PATENT DOCUMENTS

| 5,416,748 | A | | 5/1995 | Fujita |
| 5,774,409 | A | | 6/1998 | Yamazaki et al. |
| 5,781,498 | A | | 7/1998 | Suh |
| 5,986,966 | A | | 11/1999 | Nagata |
| 6,026,047 | A | * | 2/2000 | Ryu et al. .............. 365/230.06 |
| 6,191,999 | B1 | * | 2/2001 | Fujieda et al. ......... 365/230.06 |
| 6,845,028 | B2 | * | 1/2005 | Takemura .................... 365/63 |
| 2002/0024063 | A1 | | 2/2002 | Yoo |
| 2003/0022434 | A1 | * | 1/2003 | Taniguchi et al. ........... 438/240 |

* cited by examiner

Primary Examiner—Pho M Luu  
Assistant Examiner—Tha-O Bui  
(74) Attorney, Agent, or Firm—F. Chau & Associates, LLC

(57) ABSTRACT

Semiconductor memory devices having hierarchical word line structures are provided. A block of sub-word line driver circuits (SWDB) are disposed between a first block of memory and a second block of memory. A SWDB includes a plurality of sub-wordline driver (SWD) circuits arranged in a plurality of SWD columns each having four SWD circuits extending in a first direction between the first and second blocks of memory. Two adjacent SWD columns include a SWD group for driving a plurality of sub-word lines extending from the SWD group along the first direction into the first and second blocks of memory.

17 Claims, 22 Drawing Sheets

A0,A1 :PXi Coding
A2,3,4,5,6,7:NWEi Coding
A8,9,10,11 :Block Coding

SEMICONDUCTOR MEMORY DEVICE HAVING SPLIT WORD LINE DRIVER CIRCUIT WITH LAYOUT PATTERNS THAT PROVIDE INCREASED INTEGRATION DENSITY

CROSS-REFERENCE TO RELATED APPLICATION

This application claims priority to Korean Patent Application No. 2006-0110329, filed on Nov. 9, 2006, which is incorporated herein by reference.

TECHNICAL FIELD OF THE INVENTION

The present invention relates generally to semiconductor memory devices having hierarchical word line structures and, in particular, semiconductor memory devices having sub-word line driver circuitry with layout patterns that enable increased integration density and high performance operation.

BACKGROUND

Technological innovations in semiconductor fabrication technologies are driving market demands for semiconductor memory devices providing higher storage capacity, higher speed, higher integration density, and lower power consumption. The downscaling of semiconductor memory devices to submicron design rules and beyond, however, coupled with increased storage capacity poses technological challenges with respect to maintaining performance and reliability. For instance, as memory capacity increases and the pitch between adjacent patterns are made narrower, the layout of the memory arrays and peripheral devices become more problematic, especially with regard to memory core layout. When designing memory circuits, it is desirable to minimize the length and loading of wordlines. Indeed, if wordlines are too long/narrow and/or have too many memory cells connected to each wordline (i.e., a large load), wordline enable driver circuits will consume more power to drive the wordlines, and the speed of driving wordlines can decrease. To mitigate the impact on device performance with line rule downscaling and increased memory density, various memory circuit architectures have been employed including, for example, hierarchical memory bank architectures and hierarchical word line driver structures with sub word line architectures.

For instance, FIGS. 1A~1C are schematic illustrations of a semiconductor memory device having a conventional hierarchical memory bank architectures and hierarchical word line driver framework. FIG. 1A illustrates a semiconductor integrated circuit memory chip (10) having a memory cell array with a memory capacity of 1 Gb, which is divided into a plurality of memory banks, Bank A, B, C and D (or more generally, Bank-i) (e.g., 4 memory banks of 256 Mb). Each memory bank Bank-i can be independently operated with associated peripheral circuits including column decoders (11) and row decoders (12), and well as other I/O circuitry for outputting/inputting data via peripheral data I/O pads (13). Each memory bank Bank-i comprises decoder circuits and core circuits that are arranged in "unit blocks," as depicted in FIG. 1B. In particular, FIG. 1B schematically illustrates a conventional layout of each memory bank (Bank_i) in FIG. 1A, wherein each memory bank (Bank-i) comprises a plurality of 256 unit blocks BL(i) including 16 unit blocks along an x-direction (bitline/column direction) and 16 unit blocks along a y-direction (wordline/row direction).

FIG. 1C schematically illustrates a conventional layout pattern for each unit block BL-i in the memory bank Bank-i for a memory device utilizing a hierarchical sub-word line driver scheme. Each unit block BL-i includes a cell array (20), sub-word line driver (SWD) arrays (21), bit line sense amplifier (BSLA) arrays (23) and conjunction circuit blocks including PXiD driver blocks (22) and LA driver (LADRV) blocks (24). The unit block pattern BL-i depicted in FIG. 1C is repeated in both x and y directions over the memory bank Bank-i such that each memory cell array block (20) is disposed between two BLSA blocks (23) in the x (column) direction of bit lines and such that each memory cell array block (20) is disposed between two sub-word line drivers (21) in the y (wordline) direction. In one conventional hierarchical word line framework, each block sense amplifier (23) is shared by two memory cell array blocks (20) to the left and right of the BLSA (23) and each sub-word line driver (21) is shared by two memory cell array blocks (20) above and below the SWD block (21) using an interleaved layout framework, as is known in the art.

By way of specific example, FIG. 2A is a schematic illustration of one conventional framework of a unit block BL-i such as depicted in FIG. 1C in a semiconductor device having a hierarchical divided wordline scheme. As shown in FIG. 2A, a memory cell array (200) includes an array of memory cells MC (each having a cell transistor and cell capacitor in a DRAM memory) located at the intersection of a bit line BL or BLB and a sub-word line WL. The bit lines are connected to the memory cells MC and to corresponding sense amplifiers SA in BLSA blocks (230) and (231) using an open bitline architecture, for example, as is known in the art. The BSLA blocks (230) and (231) are driven by control signals generated by drivers in respective LADRV blocks (240) and (241). In the hierarchical divided wordline scheme, a wordline is divided into a plurality of sub-wordlines WL that are driven using corresponding sub-wordline driver blocks (210) and (211) located above and below the memory cell array (200). In the exemplary embodiment of FIG. 2A, there are 256 sub word lines WL that are connected to the memory cells in corresponding rows of memory cells (where the rows extend in the Y-direction). The SWD array (210) includes a plurality of sub word line driver SWD circuits that are connected to and drive the even sub wordlines (WL0, WL2, . . . WL252, WL254) in the array (200) and a memory cell array of next lower unit block below. The SWD array (211) includes a plurality of sub word line driver circuits that are connected to and drive the odd sub wordlines WL1, WL3, . . . WL253, WL255 in the array (200) as well as a memory cell array of a next upper unit block.

The SWDs in the SWD arrays (210) and (211) are connected to normal (main) wordlines NWE and sub wordline enable lines from respective PXiD drivers (220) and (221), respectively. Each SWD circuit in the even SWD array (210) drives a corresponding even sub word line in response to control signals input thereto via a corresponding normal wordline NWE (i) and a wordline enable signal generated by the PXiD drivers (220). Each SWD circuit in the odd SWD array (211) drives a corresponding odd sub word line in response to control signals input thereto via a corresponding normal wordline NWE (i) and a wordline enable signal generated by the PXiD drivers (221). The PXiD driver blocks (220) and (221) are connected to word lines PXI<0:3>, where each normal wordline NWE-i controls a group of 4 subwordlines, wherein a given subwordline in the group is activated in response to a corresponding one of the wordlines PXI (0, 1, 2, 3). For instance, NWE (0) controls subwordlines WL0, WL1, WL2, and WL3 in response to wordline enable signals PXi<0-3>, NWE (1) controls subwordlines WL4, WL5, WL6 and WL7 in response to wordline enable signals PXi<0-3> and NWE (63) controls subwordlines WL252, WL253, WL254, and WL255 in response to wordline enable signals PXi<0-3>. With reference to FIG. 1B, there is a set of normal wordline enable lines NWE(0)-NEW(63) that extends in the y-direction for each alternating even/odd column of 16 blocks (in the y direction) such that each odd and even SWD block in each even and odd column is connected to each NWE line of the corresponding set of normal wordline enable lines NWE (0)-NEW(63).

FIG. 2B schematically illustrates an exemplary embodiment of the PXiD driver (220) and the SWD array (210) of FIG. 2A. The PXiD driver (220) comprises a PXiD generator (220a), a PXiDB generator (220b) and a PXiDG generator (220c). The SWD array (210) comprises a plurality of SWD circuits (SWD0, 2, 4, ... 14) which are connected to and drive corresponding even subwordlines WL0, WL2, WL4, ..., WL14). Each NWE is connected to a pair of adjacent even SWDs in the even SWD array (220) as well as a corresponding pair of adjacent odd SWDs in the odd SWD array (211) (not specifically shown in FIG. 2B). The PXiD generator (220a), PXiDB generator (220b) and PXiDG generator (220c) generate word line activation control signals that are output on line PxID(0)/PXIDB(0)/PXiDG(0) to activate the subword line drivers (SWD(0), SWD(4), SWD(8), ... ) in each group of 4 sub word lines, as well as word line activation control signals that are output on lines PxID(2)/PXIDB(2)/PXiDG(2) to activate the subword drivers (SWD(2), SWD (6), SWD(10), ... ) in each group of 4 sub wordlines.

FIG. 3 is a flow chart that illustrates a method for accessing memory in a semiconductor memory device having a hierarchical wordline scheme such as described above. In general, for a given memory bank, Bank-I, a 12 bit address (A0, ... A11) is decoded to activate a sub wordline within one of the 256 memory cell arrays of the unit blocks. The upper four bits (A8, A9, A10, A11) are decoded to select 1 of 16 of the adjacent vertical memory blocks (step 30) (n4=16). The next seven upper address bits A2~A7 are decoded by a row decoder to generate one of 64 normal word line enable signals NWE<0:63>. The lower two address bits A0, A1 are decoded by PXI decoders to drive a corresponding one of the sub word lines PXI<0:3>. As a result, one sub wordline out of the groups of 4 sub wordlines associated with the selected NWE is active where 4K bits of memory cells are enabled.

FIG. 4 illustrates a conventional sub word line driver circuit (40), which may be implemented for the SWDs in the even and odd SWD arrays (220) and (221) of FIG. 2A, for example. In general, a sub-word line driving circuit (40) drives a sub-word line WL in response to control signals NWE, PXID, PXIDG and PXIDB, and includes NMOS transistors T1, T2, T3 and T4. The sub word line driver (40) includes four control input nodes connecting to PXiD, PXiDG, PXiDB and NWE control signal lines, two power nodes for VPP and VSS and an output node N5 connected to a subword line WL. The NMOS transistor T3 has a channel connected between the NWE input (node N4) and a node N5 and a gate G3 connected to the word line activation signal PXiDG. The NMOS transistor T2 has a channel connected between control input node N1 (signal PXiD) and the output node N5 and a gate G2 connected to a boosting node N3. The NMOS transistor T1 has a channel connected between the gate G2 of transistor T2 and the NWE input node N4 and a gate G1 connected to the power voltage VPP input. The NMOS transistor T4 has a channel connected between the output node N5 and ground voltage node VSS and a gate G4 connected to a control signal input node PXiDB.

FIG. 5 is a timing diagram that illustrates operation of the sub-word line driver (40) of FIG. 4. In particular, FIG. 5 illustrates various voltage waveforms of control voltages NWEi, PXiD, PXiDB and PXiDG that are applied to drive a subwordline WLi. At time to, before an active operation, all of the signal lines shown in FIG. 5 are at Vss except PXIDB, which is an active low level IVCC that is applied to the gate G4 of transistor T4 to cause the WL at node N5 to be pulled down to VSS such that sub-word lines WL are precharged to Vss. At time t1, when a corresponding word line enable signal NWEi is activated, the boosting node N3 is charged from VSS to VPP-Vth by an overlap capacitance existing between the gate G2 and drain (N1) of the transistor T2 (where Vth denotes a threshold voltage of the NMOS transistor T1). Therefore, the boosted voltage VPP is supplied to the sub-word line WL through the NMOS transistor T2. At time t2, the control voltage PXiDB transitions to VSS causing transistor T4 to turn off. At time t3, the control signals PXID and PXIDG are asserted. The control signal PXiD is enabled to VPP, which causes the voltage at boosting node N3 to increase to 2 Vpp-Vth. This causes the corresponding sub-word line driver SWD to drive the corresponding sub-word line to Vpp. The NMOS transistor T3 serves to maintain the sub-word line WL in logic "low" state when the main word line driving signal NWE is in logic "low" state and the sub-word line driving signal PXID is in logic "high" state. After the access operation is complete, the sub-word line driver precharges the sub-word line WL to Vss.

Conventional semiconductor memory devices having a sub word line driver structure as described above may have an increased layout area due to the presence of the sub wordline driver arrays between the memory arrays. When designing semiconductor memory devices with sub word line driver framework, it is important to minimize the layout area required for the sub wordline drivers. Indeed, the layout area of the sub word line driving circuits has a significant influence upon the overall operating efficiency of the device memory device and the level of integration that may be achieved.

SUMMARY OF THE INVENTION

Exemplary embodiments of the invention generally include semiconductor memory devices having hierarchical word line structures and, in particular, semiconductor memory devices having sub-word line driver circuitry with layout patterns that enable increased integration density and high performance operation.

In one exemplary embodiment of the invention, a semiconductor memory device having a block of sub-word line driver circuits (SWDBs) disposed between a first block of memory and a second block of memory is provided. The SWDBs include a plurality of sub-wordline driver (SWD) circuits arranged in a plurality of SWD columns each comprising four SWD circuits extending in a first direction between the first and second blocks of memory, wherein two adjacent SWD columns comprises a SWD group for driving a plurality of sub-word lines extending from the SWD group along the first direction into the first and second blocks of memory. In one exemplary embodiment, each SWD group drives even sub-wordlines extending into the first and second blocks of memory or odd sub-wordlines extending into the first and second blocks of memory.

In another exemplary embodiment, each SWD circuit comprises a first transistor, a second transistor, a third transistor and a fourth transistor, wherein the first transistor of at least four SWD circuits of a given SWD group are arranged adjacent to each other and share an active region. The first transistors may have control gate electrodes that are substantially L-shaped. The second transistor of at least four SWD circuits of a given SWD group may be arranged adjacent to each other and share and a ground node. The second transistors may be arranged in a central region of the SWDB between the first and second memory blocks.

According to another aspect of the invention, a semiconductor DRAM (dynamic random access memory) device is provided, comprising: a plurality of separately controlled memory banks, wherein each memory bank comprises: a matrix of separate memory blocks extending in column and row directions over the memory bank; a block of row decoder circuits disposed along one side of the memory bank, a set of n normal wordlines extending from each block of row decoder circuits along each row of memory blocks of the memory bank; a block of sub-word line driver circuits (SWDB) disposed between each memory block in row direction of the memory band and connected to each set of n normal wordlines extending along the given row of memory blocks, wherein each SWDB comprises a plurality of sub-wordline driver (SWD) circuits arranged in a plurality of SWD columns each comprising four SWD circuits extending in a first direction between the first and second blocks of memory, wherein two adjacent SWD columns comprises a SWD group for driving a plurality of sub-word lines extending from the SWD group along the first direction into the first and second blocks of memory.

These and other exemplary embodiments, aspects, objects, features and advantages of the present invention will become apparent from the following detailed description of exemplary embodiments, which is to be read in connection with the accompanying drawings.

BRIEF DESCRIPTION OF THE DRAWINGS

For instance.

DETAILED DESCRIPTION OF EXEMPLARY EMBODIMENTS

Figure 1A:
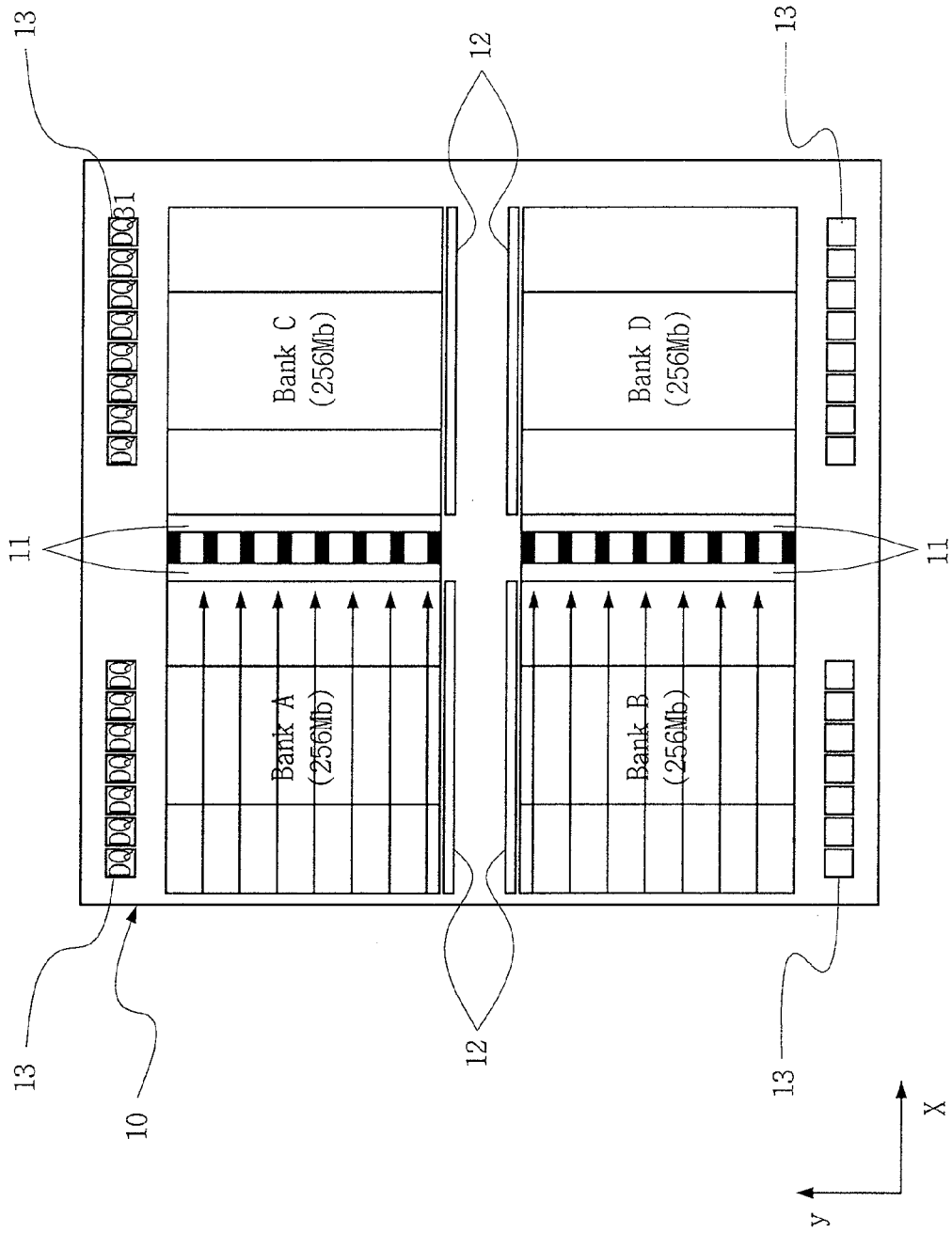
FIGS. 1A~1C are schematic illustrations of a semiconductor memory device having a conventional hierarchical memory bank architectures and hierarchical word line driver framework.
Figure 1B:
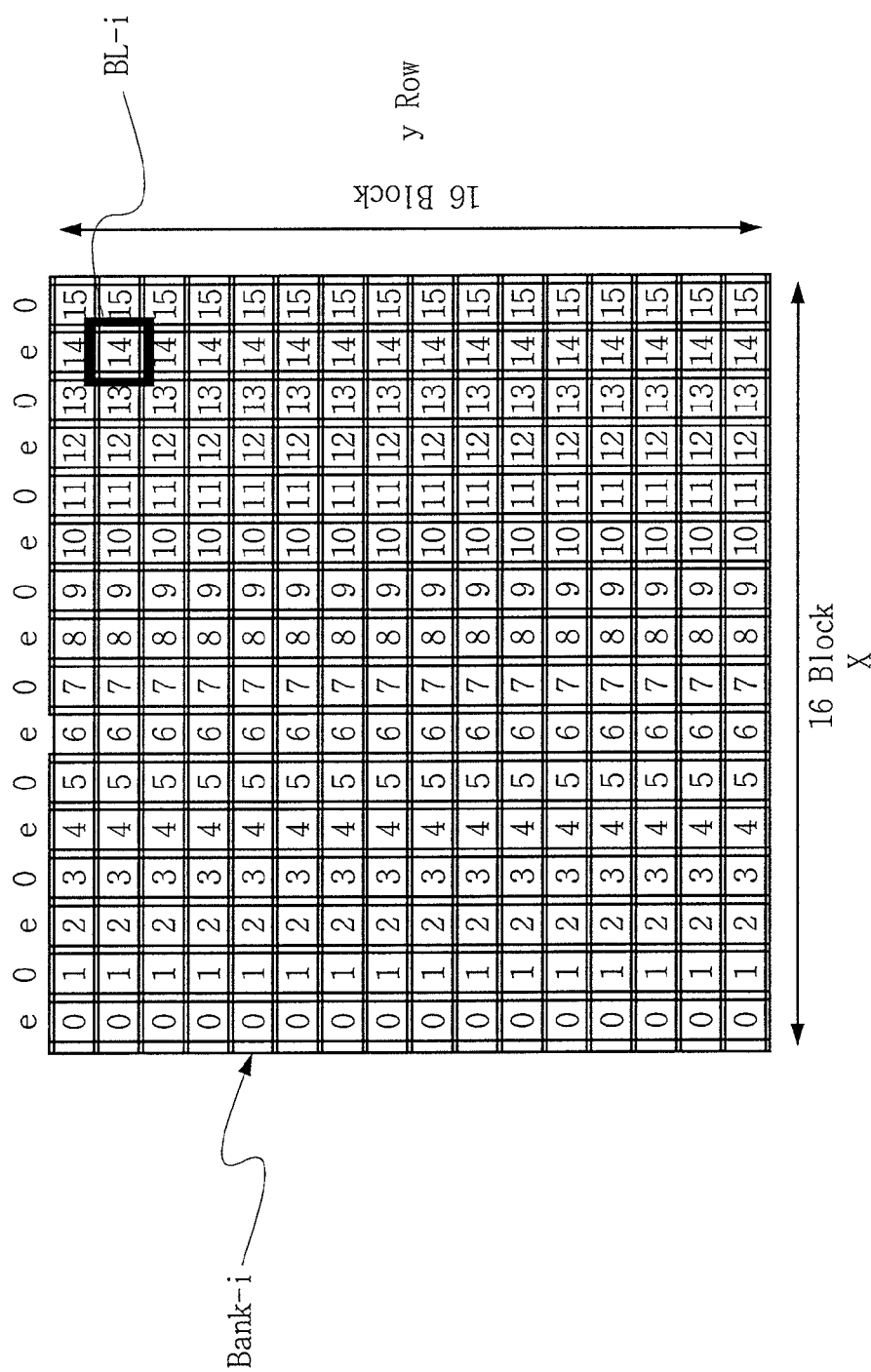
Figure 1C:
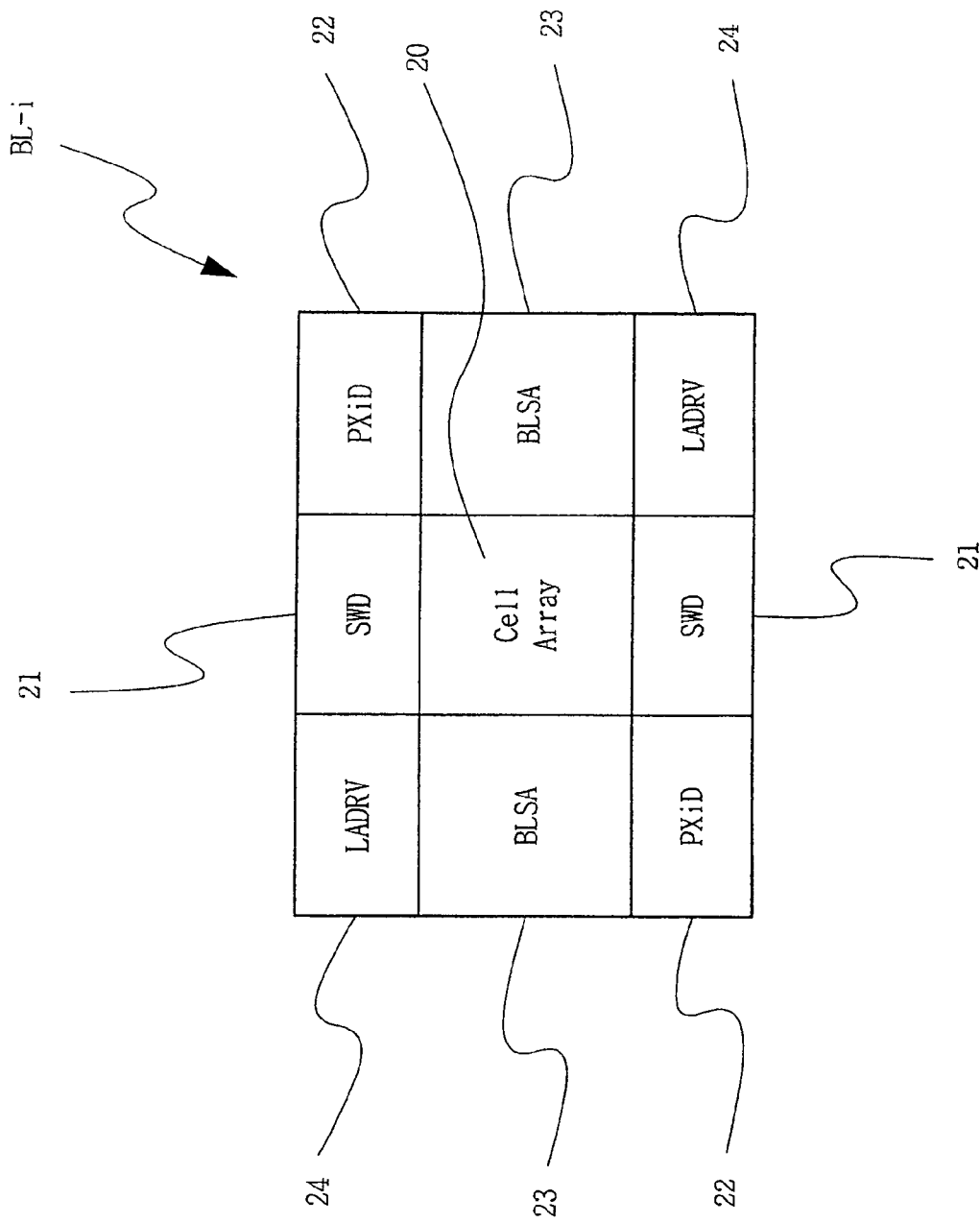
Figure 2A:
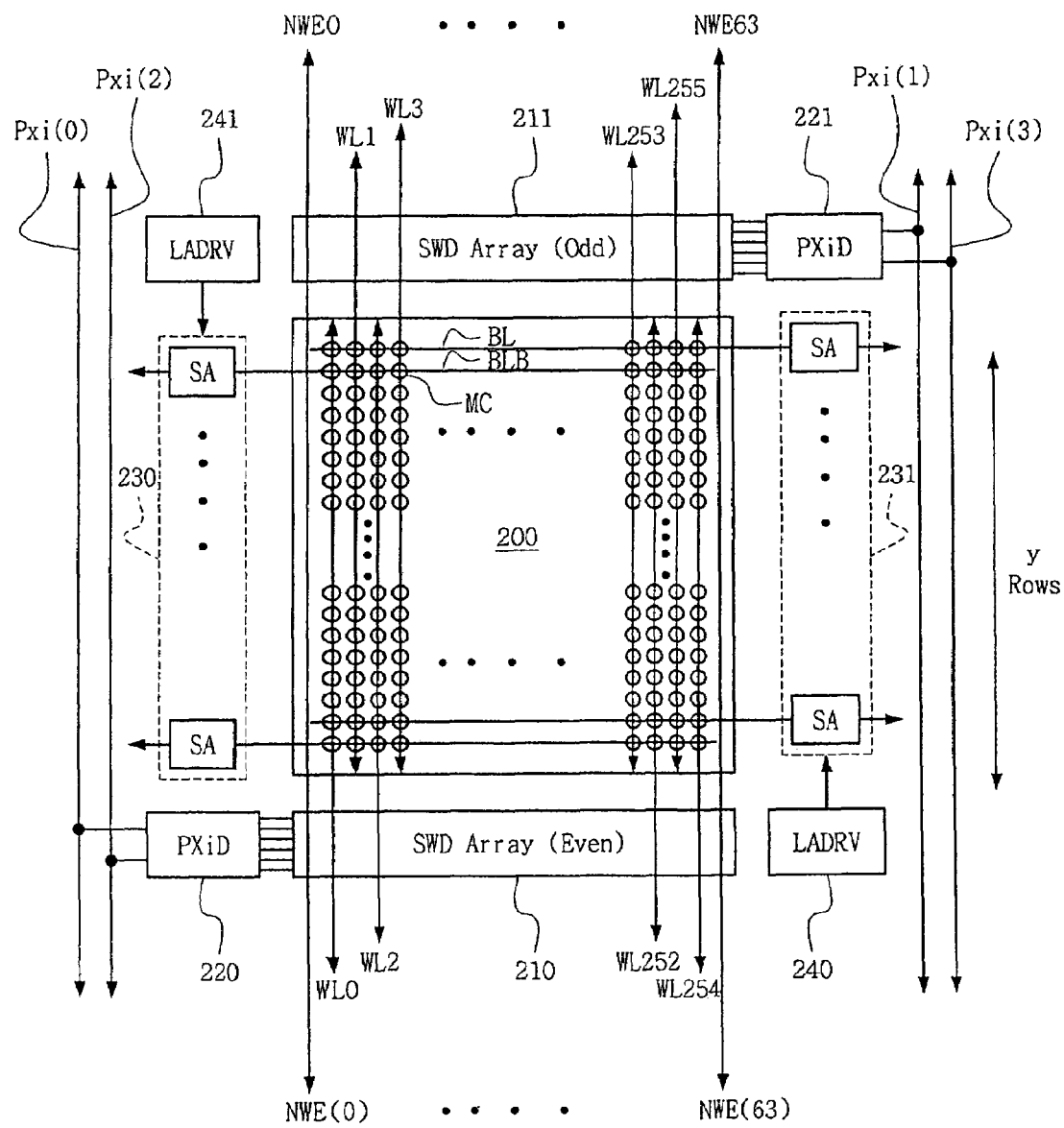
FIG. 2A is a schematic illustration of one conventional framework of a unit block BL-i such as depicted in FIG. 1C in a semiconductor device having a hierarchical divided wordline scheme.
Figure 2B:
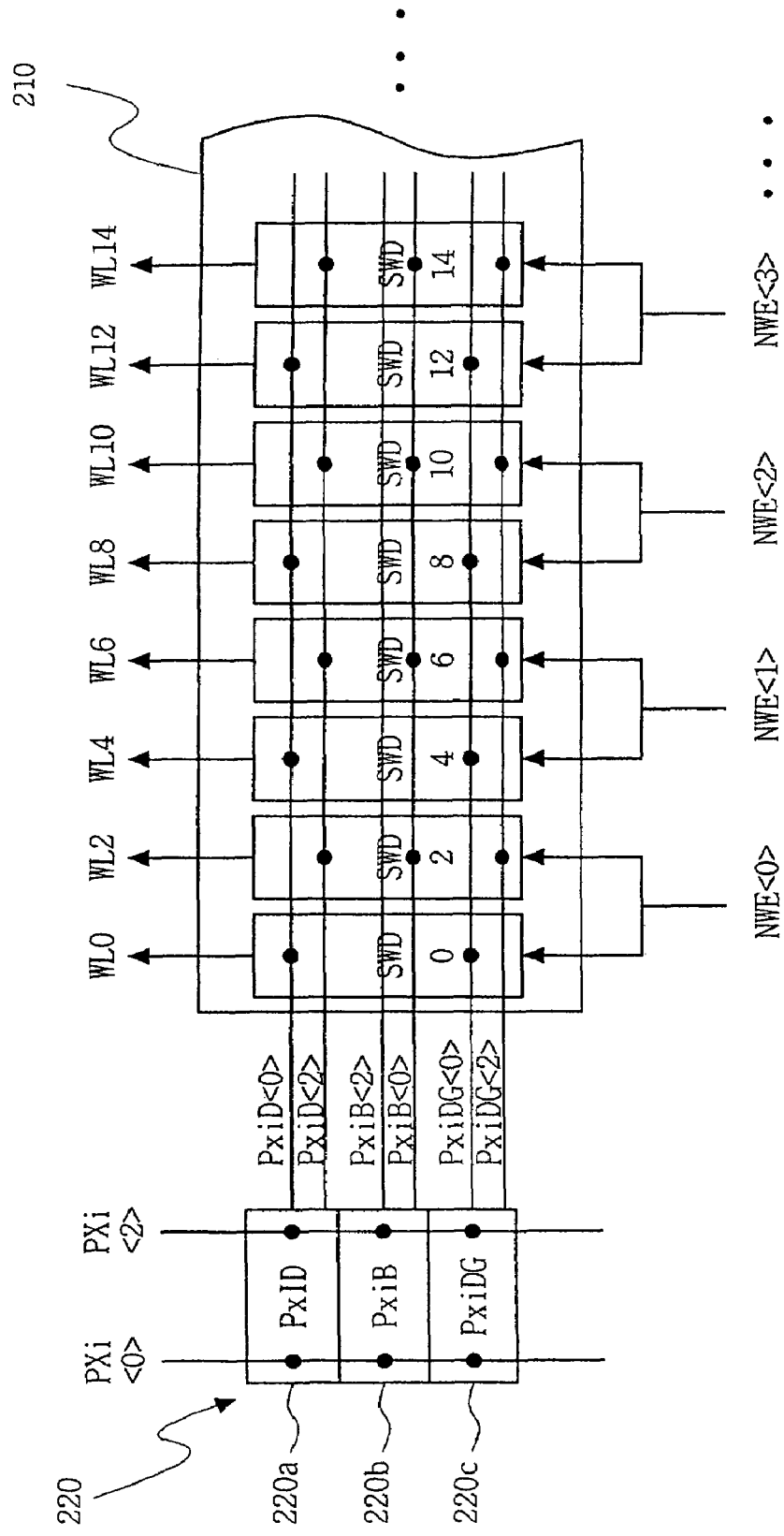
FIG. 2B schematically illustrates a conventional embodiment of a PXiD driver and SWD array of FIG. 2A.
Figure 3:
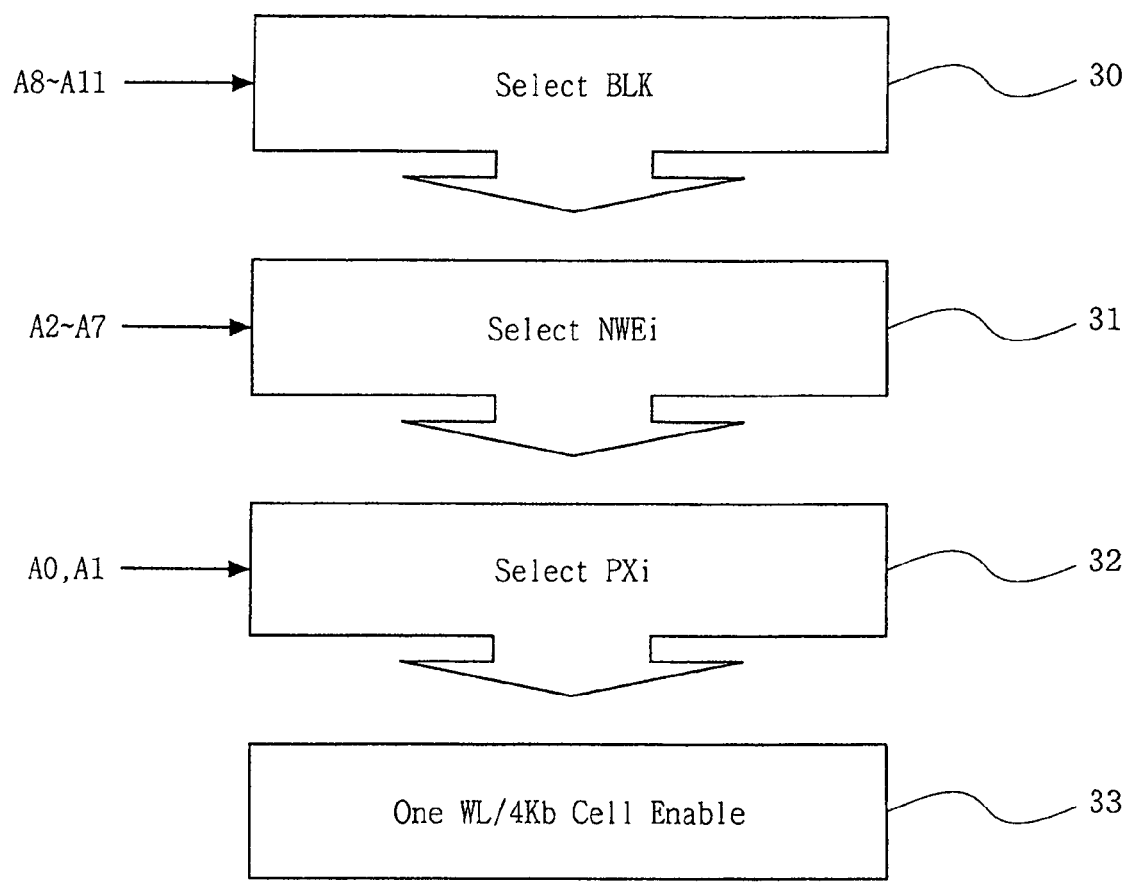
FIG. 3 is a flow chart that illustrates a method for accessing memory in a semiconductor memory device having a hierarchical wordline scheme.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 6:
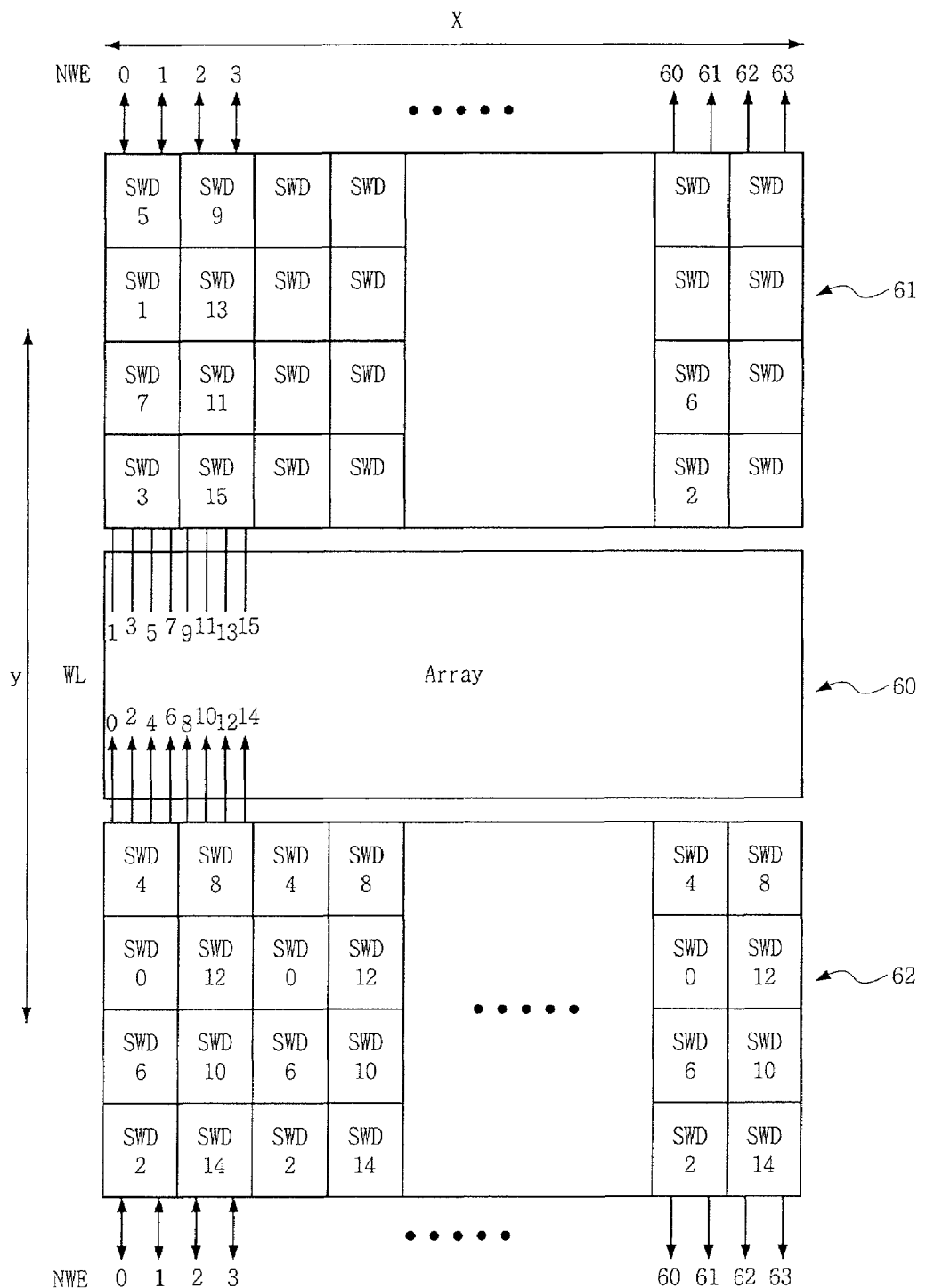
FIG. 6 schematically illustrates a layout pattern for sub word line drivers according to an exemplary embodiment of the invention.

FIG. 6 schematically illustrates a layout pattern for sub word line drivers according to an exemplary embodiment of the invention. FIG. 6 illustrates a memory cell array (60) disposed between an odd SWD array (61) and even SWD array (62). FIG. 6 illustrates a layout structure where each SWD array (61) and (62) comprises adjacent groups of four vertically stacked sub word line drivers (stacked in the y (row) direction) that extend in the x (bitline) direction over the array (60). In one exemplary embodiment of the invention, the SWD array (61) includes SWD drivers that drive odd numbered subword lines WL of the array (60) and the SWD array (62) includes SWD drivers that drive even numbered wordlines WL of the array (60). For instance, in FIG. 6, a first group of stacked SWDs in the SWD array (62) includes SWDs 0, 2, 4 and 6 that drive corresponding subwordlines WL 0, 2, 4, 6 of array (60) and a second group of stacked SWDs (8, 10, 12, 14) drive corresponding sub wordlines WL 8, 10, 12 and 14 of array (60). A first group of stacked SWDs in the SWD array (61) includes SWDs 1, 3, 5 and 7 that drive corresponding subwordlines WL 1,3, 5 and 7 of array (60) and a second group of stacked SWDs (9, 11, 13, 15) that drive corresponding subwordlines WL 9, 11, 13, 15) of array (60). With this exemplary layout, an increase in metal pitch is realized and more compact layout in x direction since every eight sub word lines WL of polysilicon are classified as respective groups and two normal word lines NWE metal line pass over the eight sub word line groups of poly-silicon.

Moreover, to minimize the space occupied by each SWD array (61) and (62) in the y direction, the SWD driver circuits are patterned such that two adjacent vertically stacked SWDs comprise a SWD set of eight SWDs that share signal nodes. For instance, in the even SWD array (62), the first two groups of 4 stacked SWDs (0, 2, 4, 6, 8, 10, 12, 14) form a set of 8 even SWDs that have a compact layout pattern, which is repeated in the X (direction of bit line) across the array (60). Moreover, in the odd SWD array (61), the first two groups of 4 stacked SWDs (1, 3, 5, 7, 9, 11, 13, 15) form a set of 8 odd SWDs that have a compact layout pattern, which is repeated in the X (direction of bit line) across the array (60). The layout patterns for the odd and even SWD sets are the same.

Figure 4:
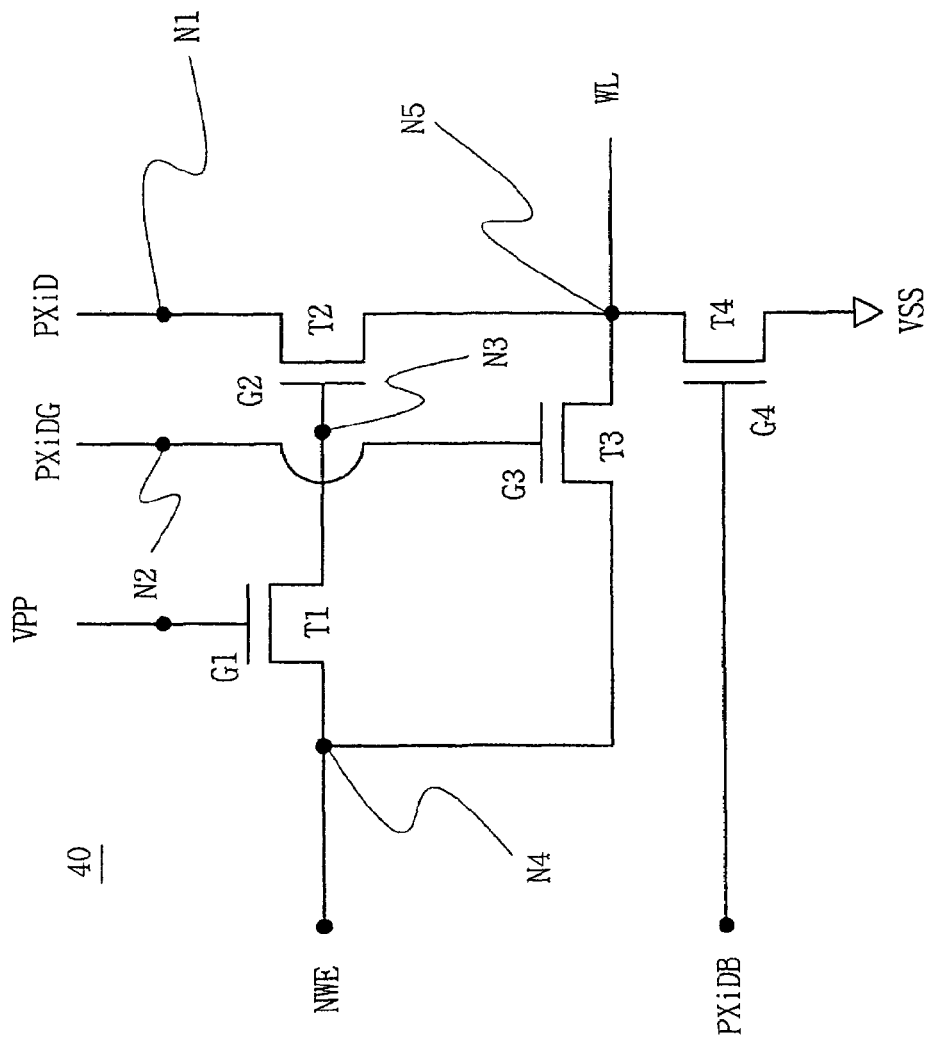
FIG. 4 is a schematic illustration of a conventional sub word line driver circuit.
Figure 5:
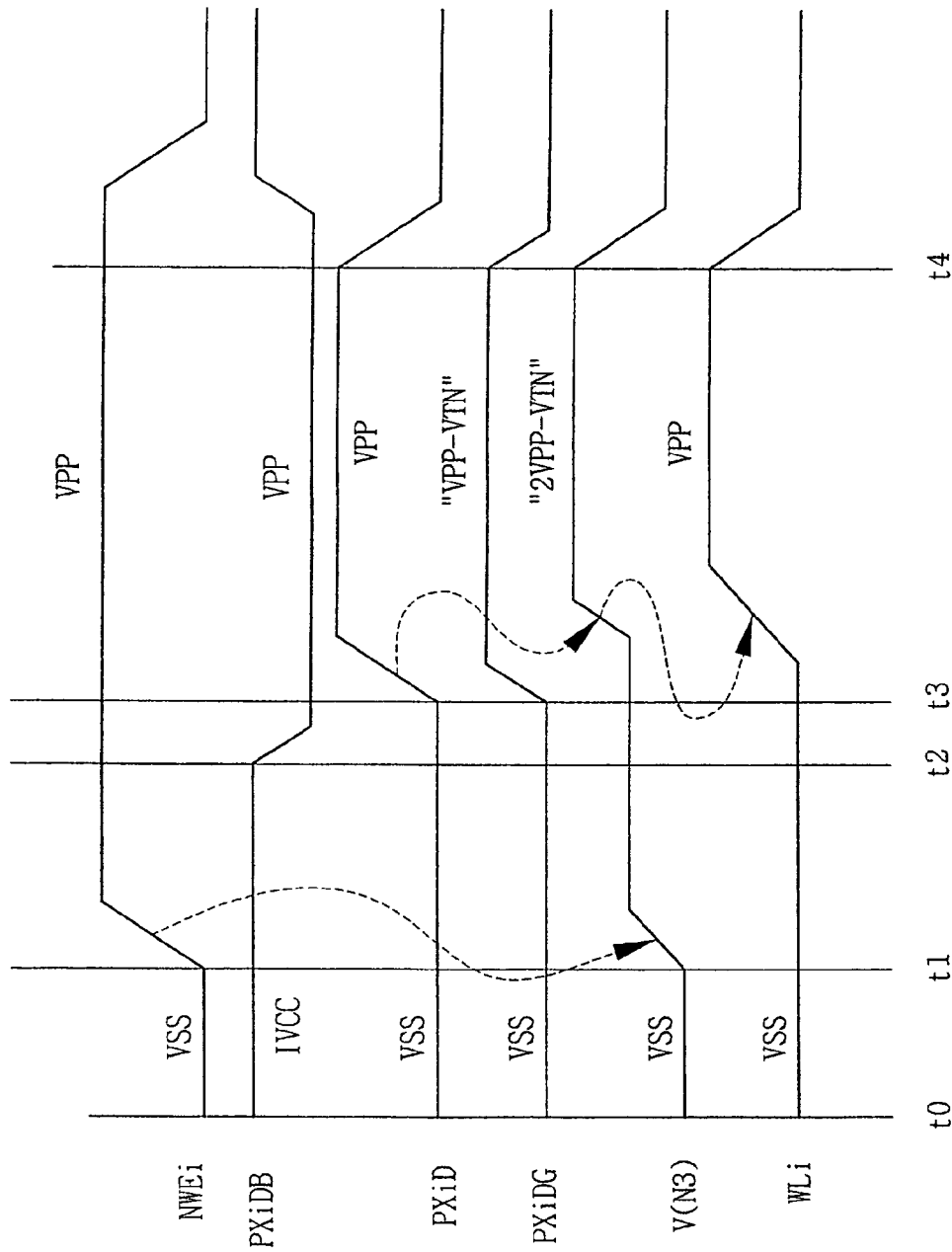
FIG. 5 is a timing diagram that illustrates operation of the sub-word line driver of FIG. 4.
Figure 7:
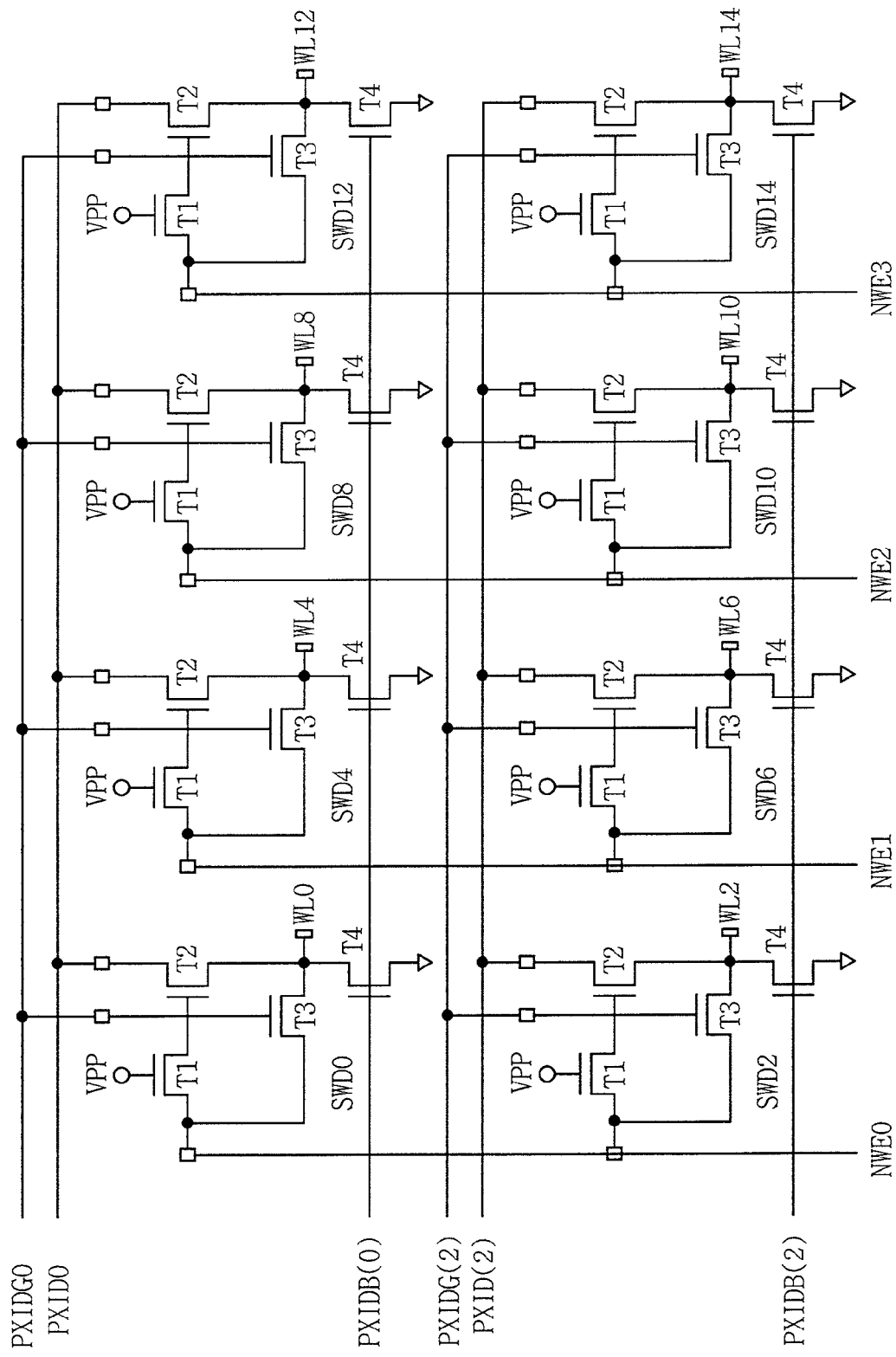
FIG. 7 is a schematic circuit diagram of an SWD group according to an exemplary embodiment of the invention

FIG. 7 is a schematic circuit diagram of the first even SWD set of the even SWD array (62) of FIG. 6. As shown, each SWD0~SWD14 is connected to a respective sub word line WL0~WL14, and is controlled by two pairs of PXiD and PXiDG control signals. Each SWD0~SWD14 is an NMOS type SWD as described above with reference to FIG. 4. As will be explained, the SWD group can have a layout pattern comprising two adjacent columns of 4 stacked SWDs where signal connections are shared to reduce space. For instance, in FIG. 7, the layout pattern of transistors T1, T2, T3 and T4 for the SWDs 0, 4, 8 and 12 is formed such that the PxID(0) signal node is shared by the transistors T2 of SWDs 0, 4, 8, 12 and such that the transistors T4 share the PXiDB(0) signal node and ground VSS node. Moreover, the layout pattern of transistors T1, T2, T3 and T4 for the SWDs 2, 6, 10 and 14 is formed such that the PXiD(2) signal node is shared by the transistors T2 of SWDs 2, 6, 10 and 14 and such that the transistors T4 share the PXiDB(2) signal node and ground VSS node.

Figure 8:
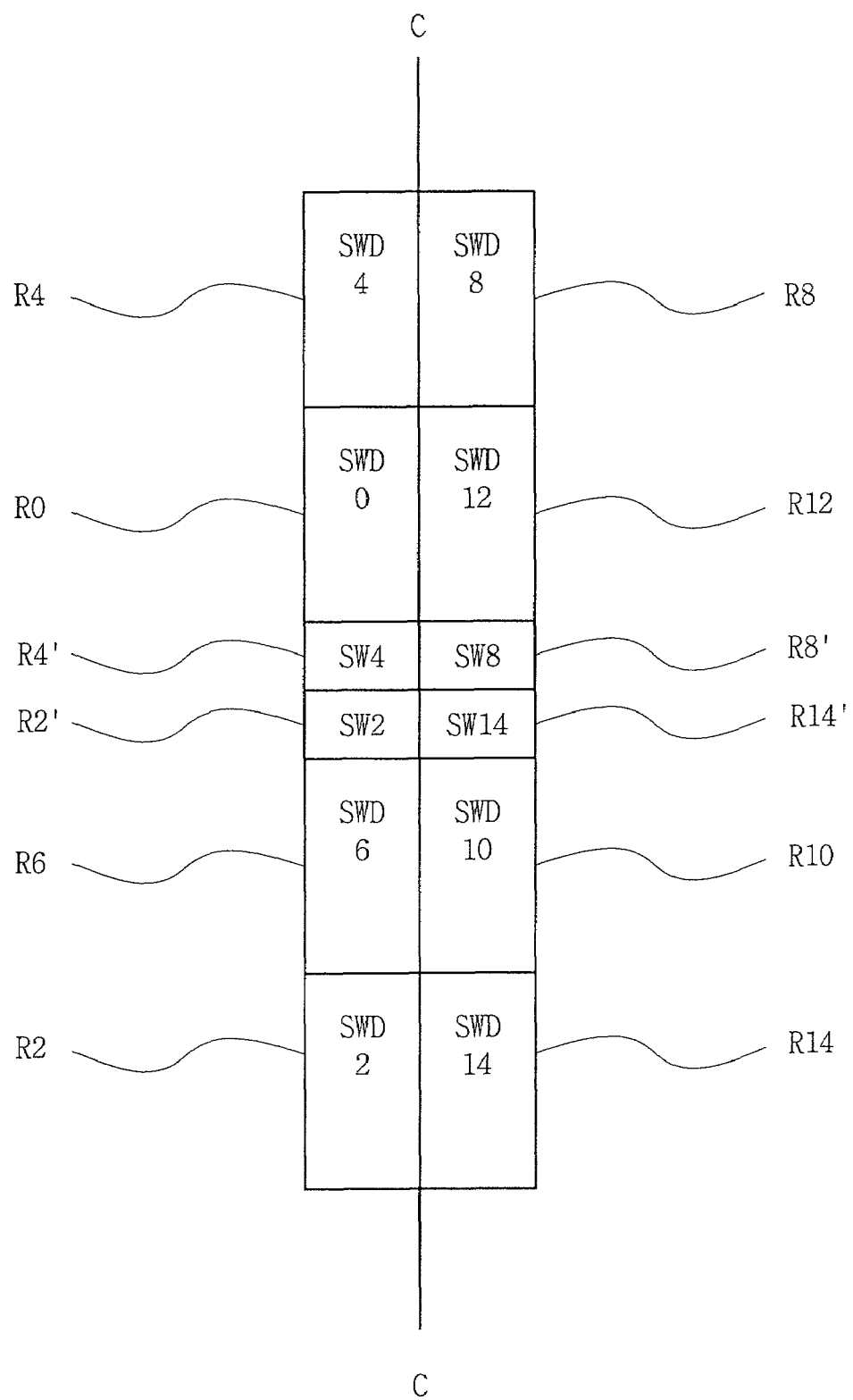
FIG. 8 depicts a general layout pattern of a group of sub word line drivers SWD according to an exemplary embodiment of the invention, FIG. 9 schematically illustrates an exemplary layout of the transistors for each of the SWD drivers in FIG. 7 in each of the corresponding regions R depicted in FIG. 8.
Figure 9:
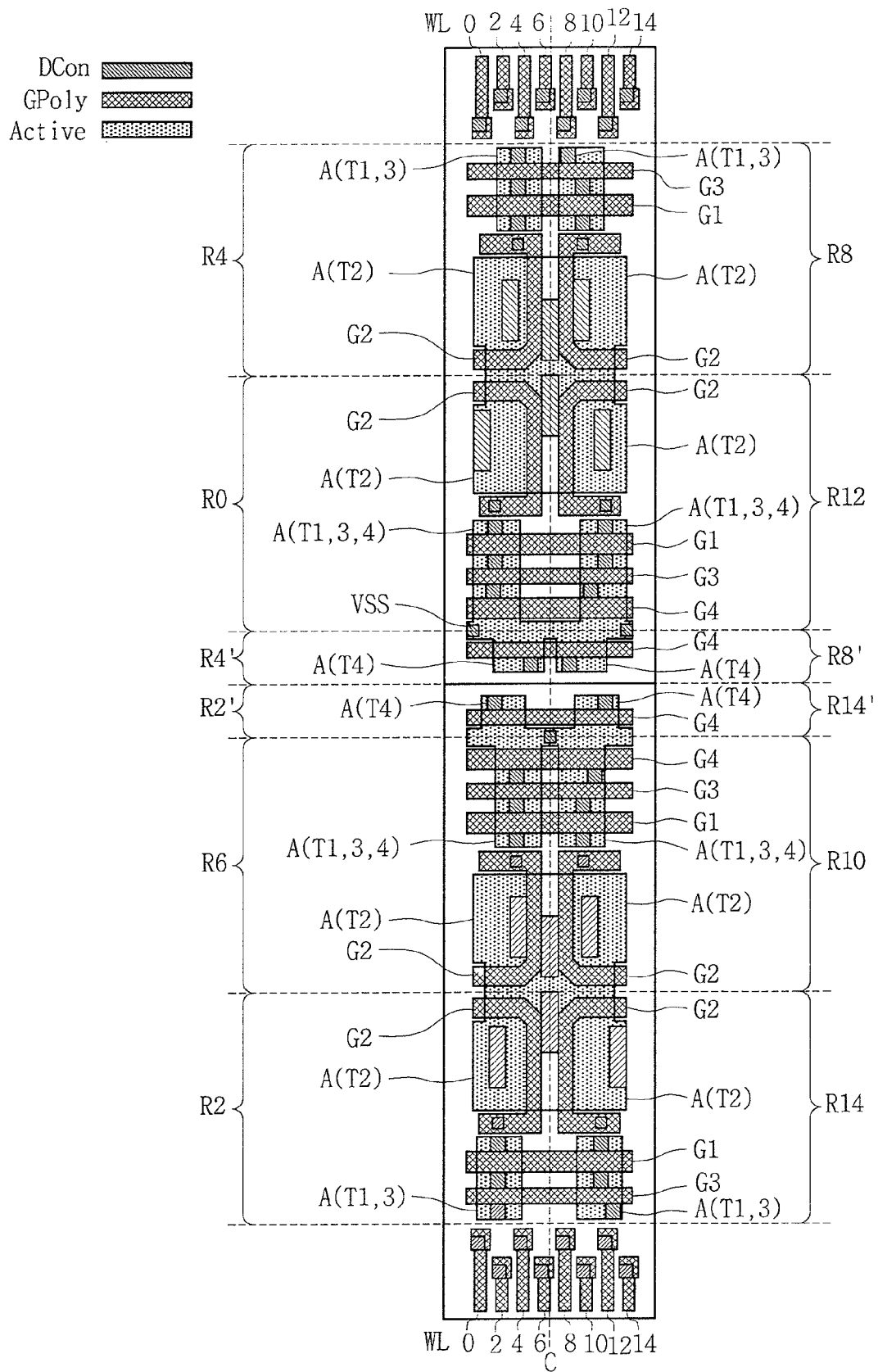
Figure 10A:
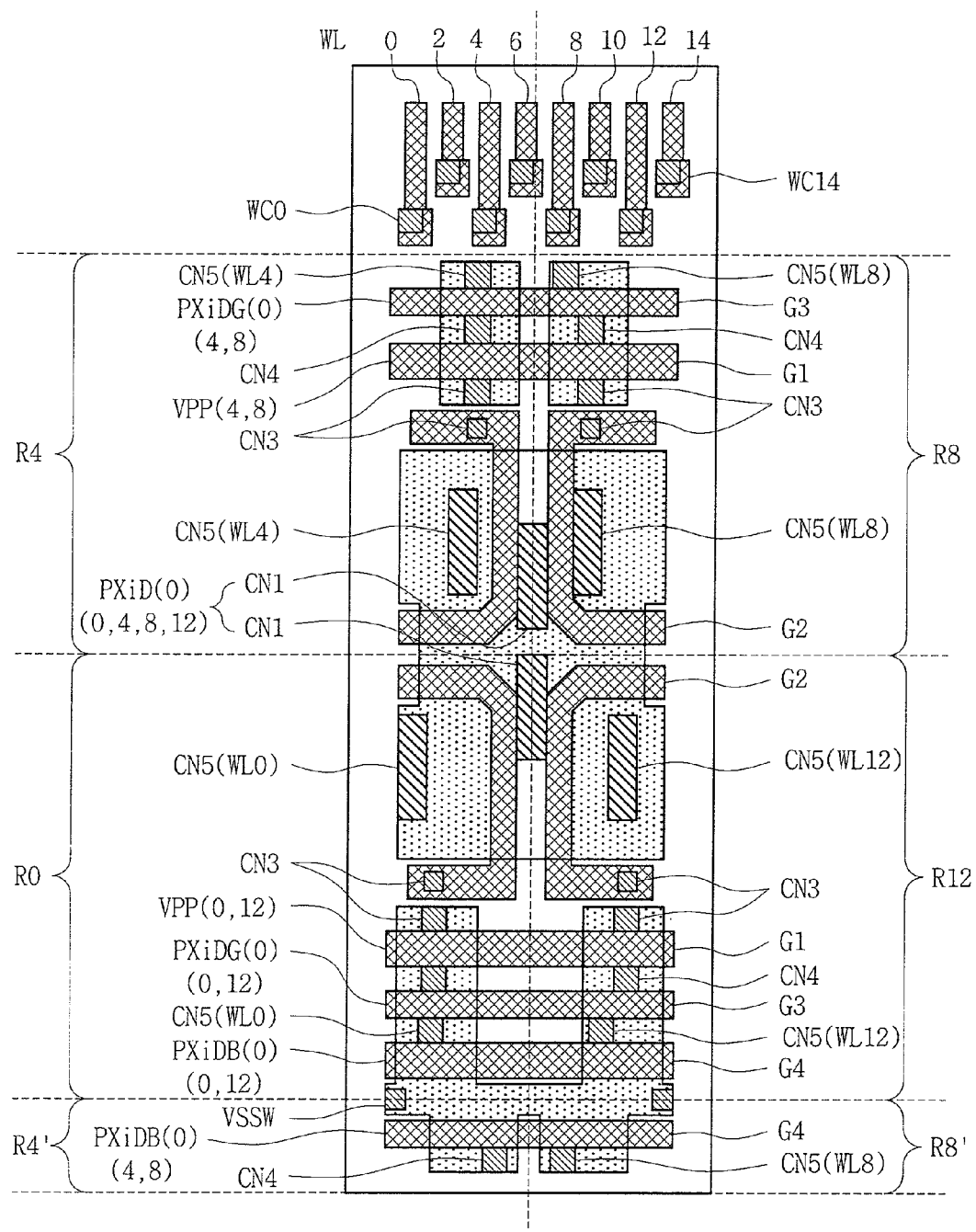
FIGS. 10A/10B are exploded views of upper and lower halves of the SWD group of FIG. 9
Figure 10B:
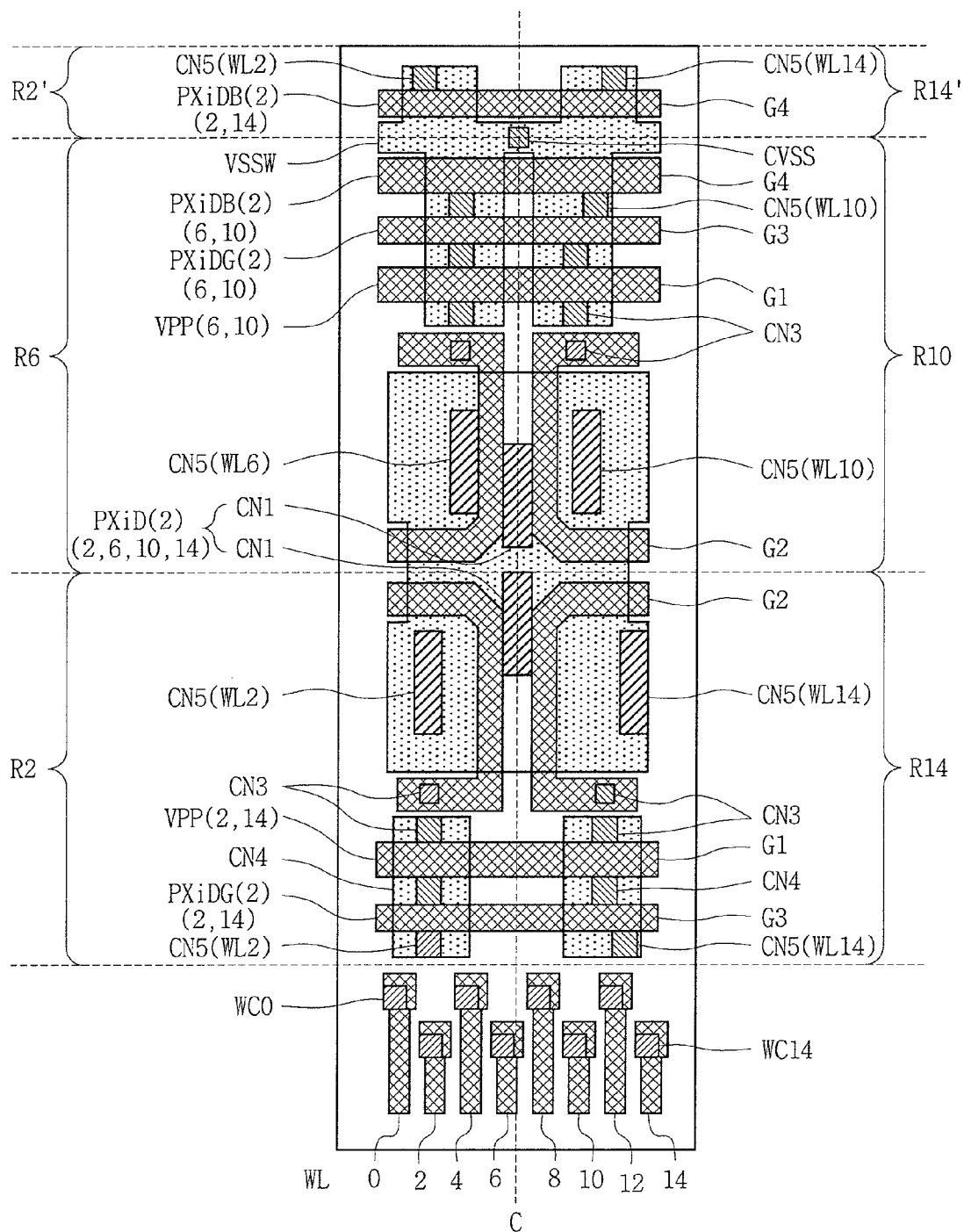

An exemplary layout pattern for the schematic circuit of FIG. 7 will now be discussed in further detail with reference to FIGS. 8, 9, 10A, 10B and 11A~11F. In general, FIG. 8 is a schematic diagram of a layout pattern for a SWD set according to an exemplary embodiment of the invention. For purposes of illustration, FIG. 8 depicts a general layout pattern of sub word line drivers SWD (0, 2, 4, 6, 8, 10, 12, 14) of FIG. 7. FIG. 8 shows different regions R0, R2/R2', R4/R4', R6, R8/R8', R10, R12 and R14/R14' in which the transistors T1~T4 of respective SWD drivers 0, 2, 4, 6, 8, 10, 12 and 14 are formed. FIGS. 9, 10A and 10B illustrate an exemplary layout of the transistors T1, T2, T3 and T4 for each of the SWD drivers in FIG. 7 in each of the corresponding regions R depicted in FIG. 8, including the active transistor regions, polysilicon gate lines, and contacts (DC) locations of transistor gates and diffusion (drain/source) regions in the active regions.

Figure 11A:
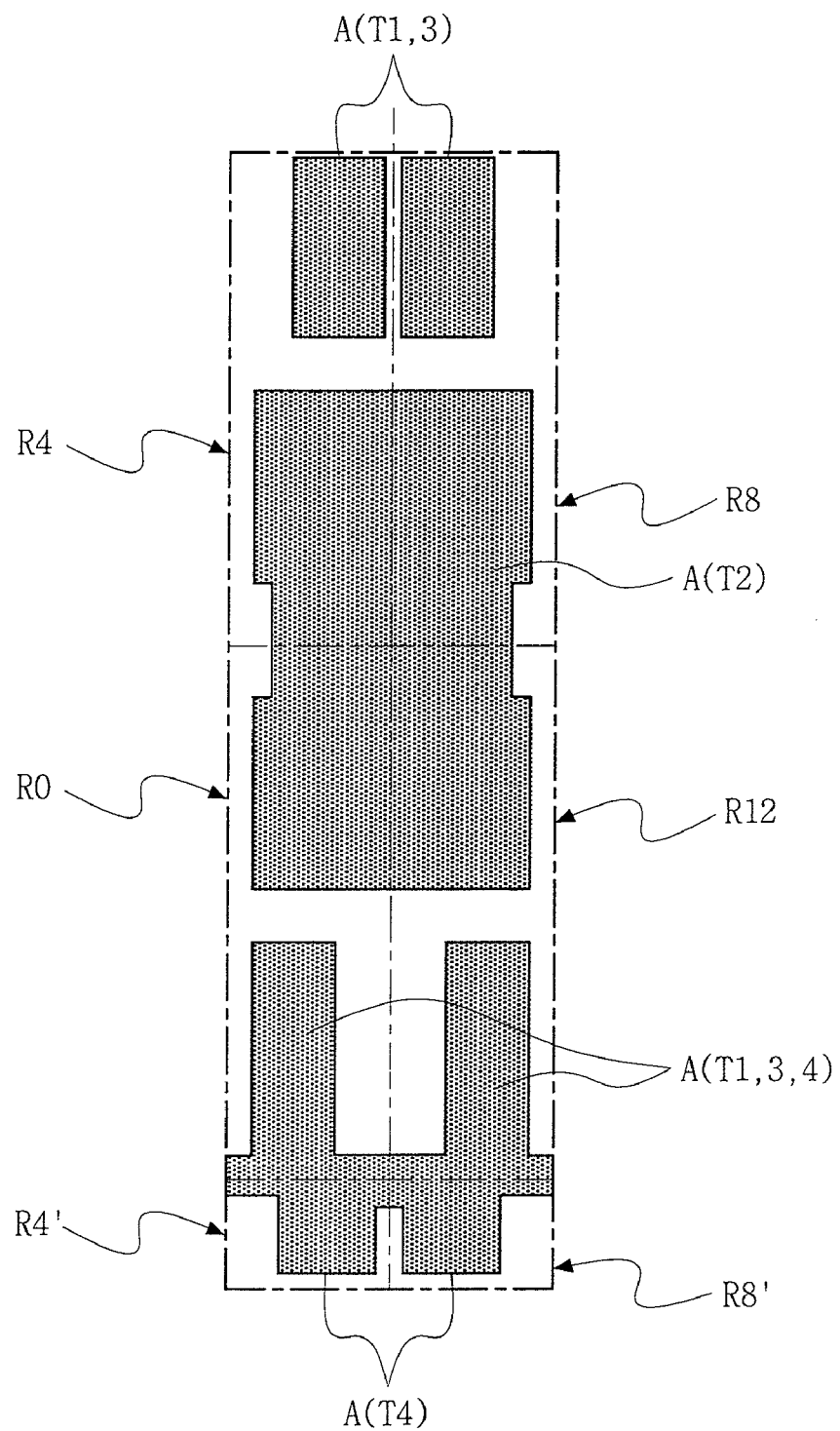
FIGS. 11A~11H schematically illustrate various levels of the FEOL circuitry and BEOL metallization patterns of the upper half of the SWD group of FIG. 9.
Figure 11B:
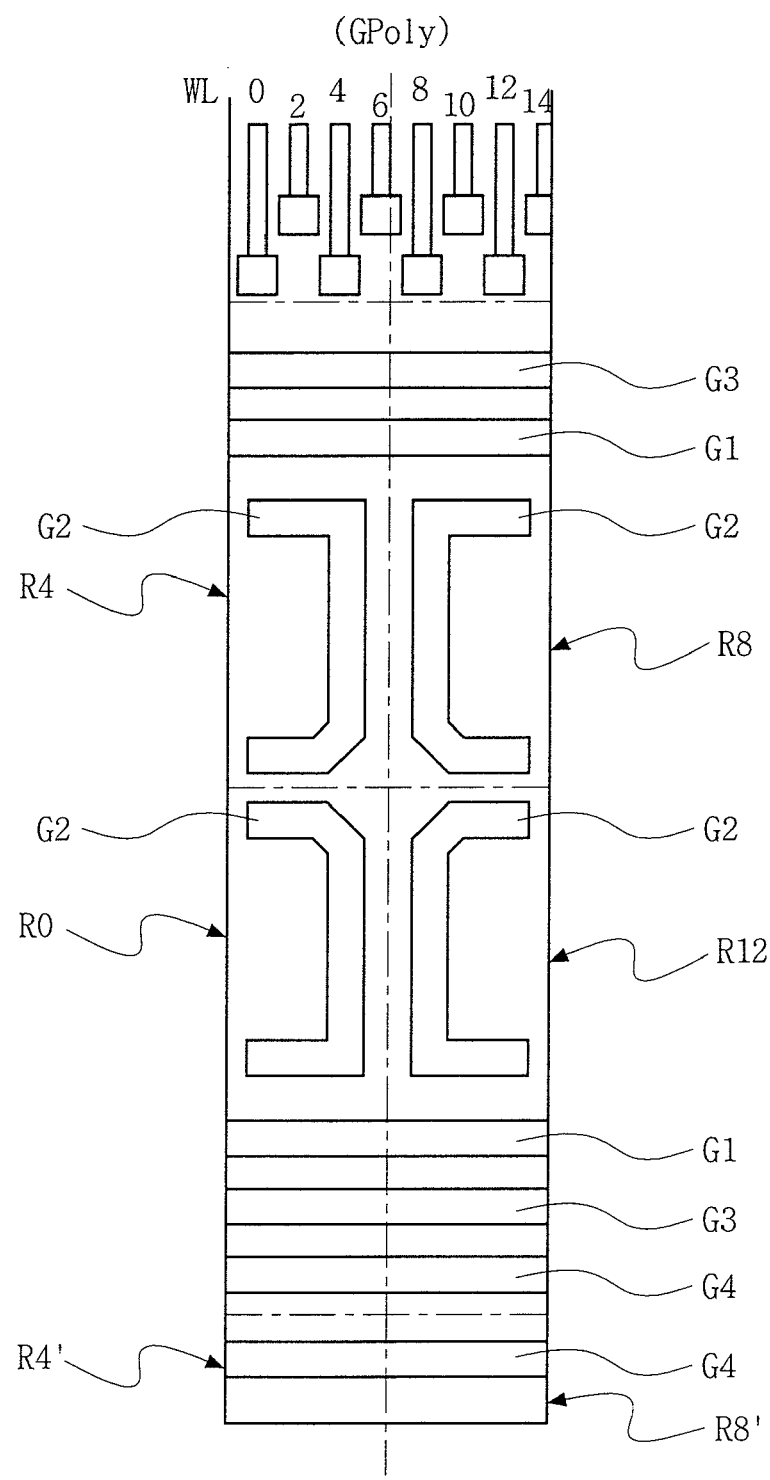
Figure 11C:
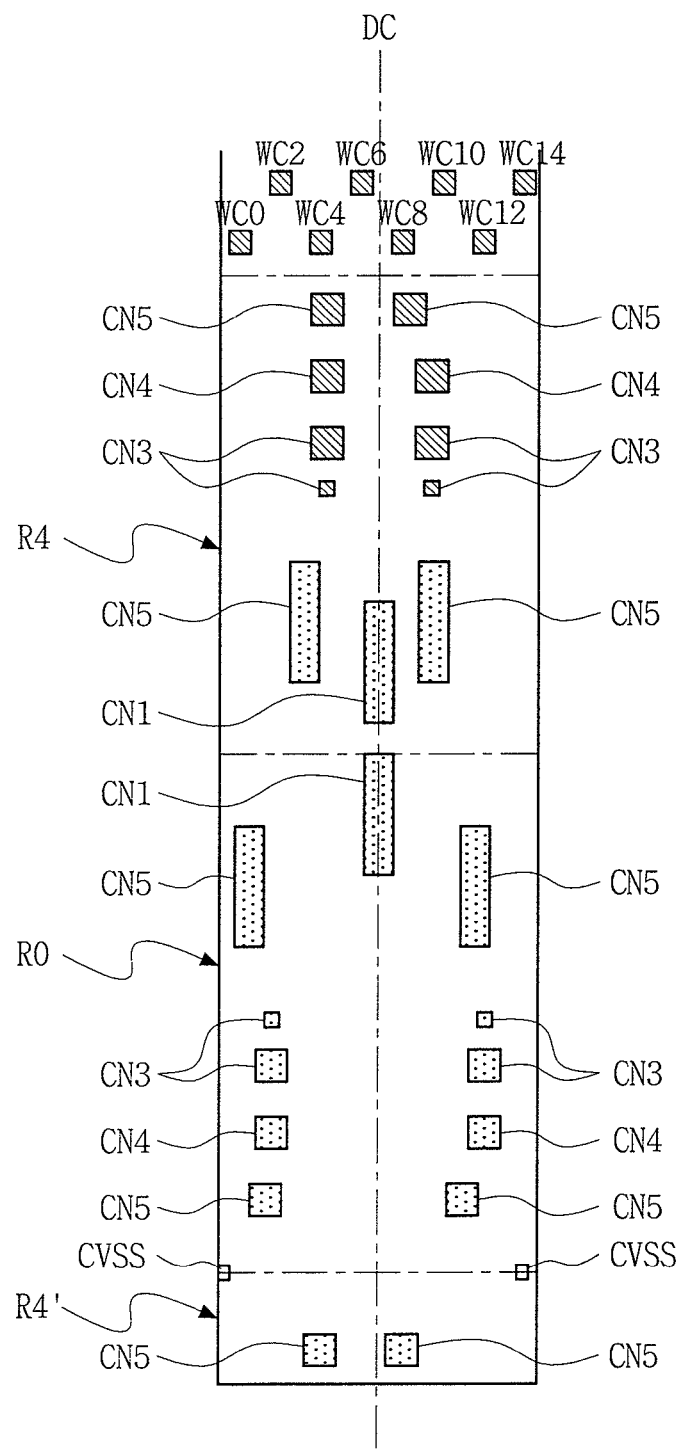
Figure 11D:
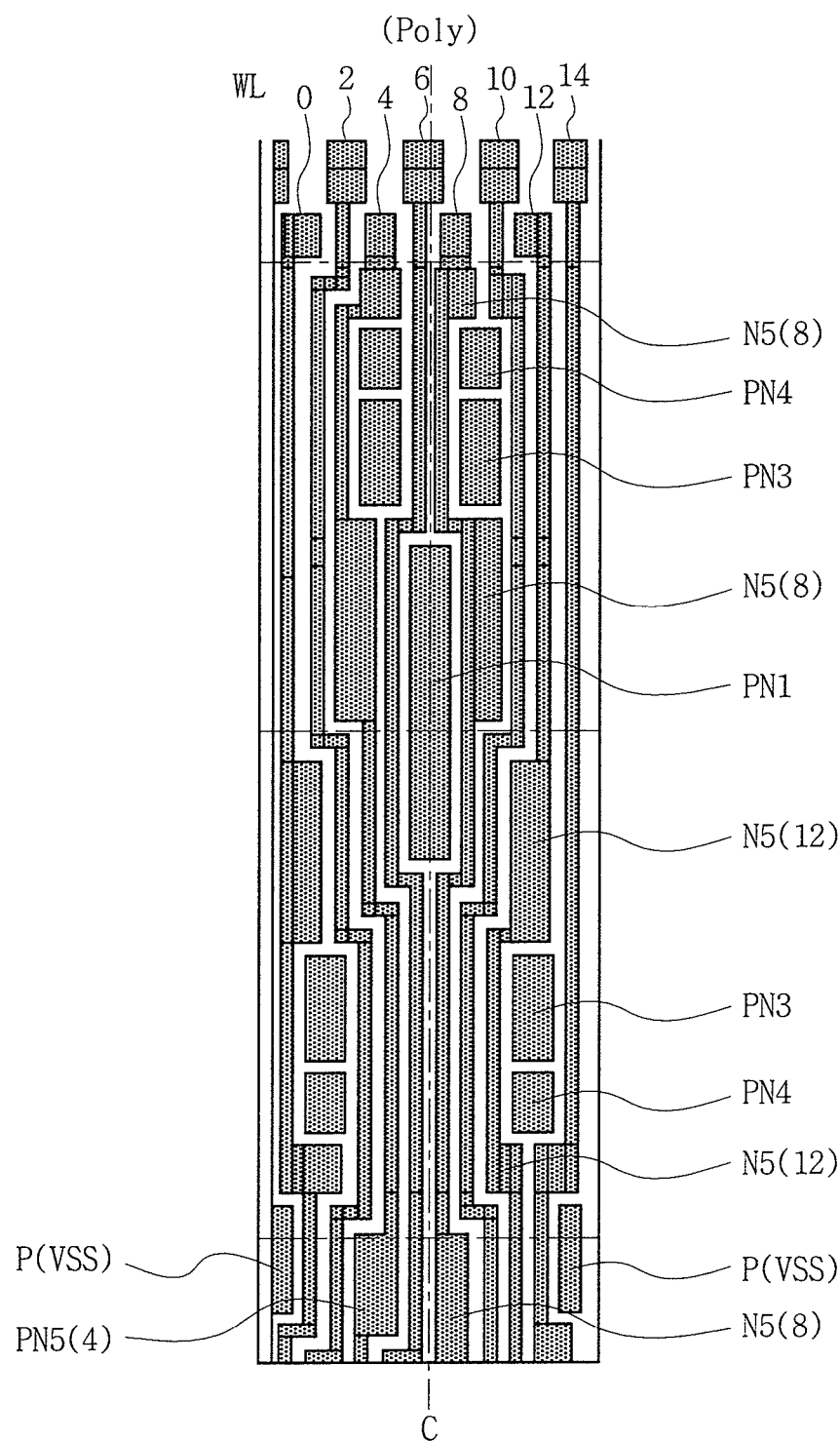
Figure 11E:
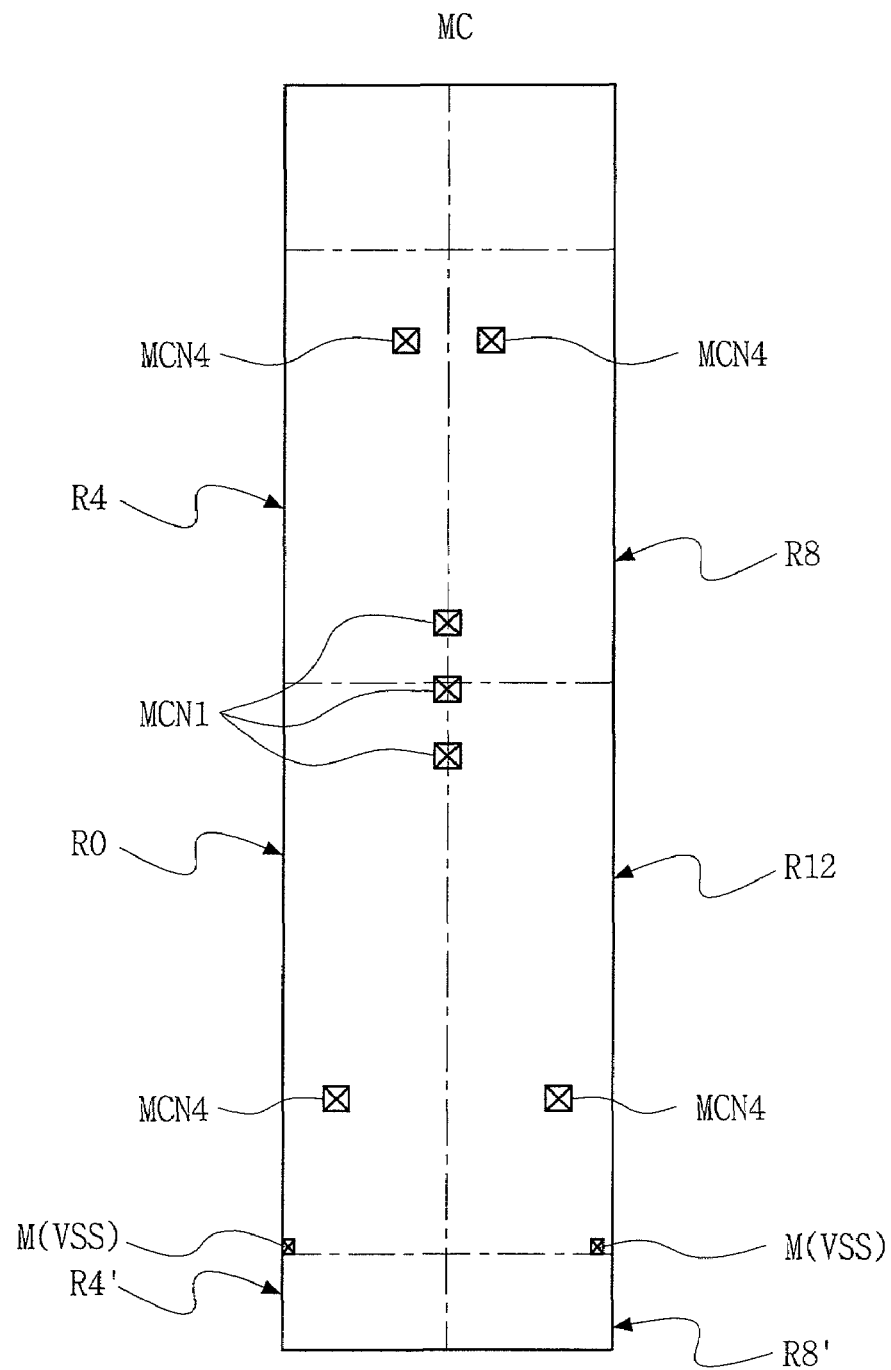
Figure 11F:
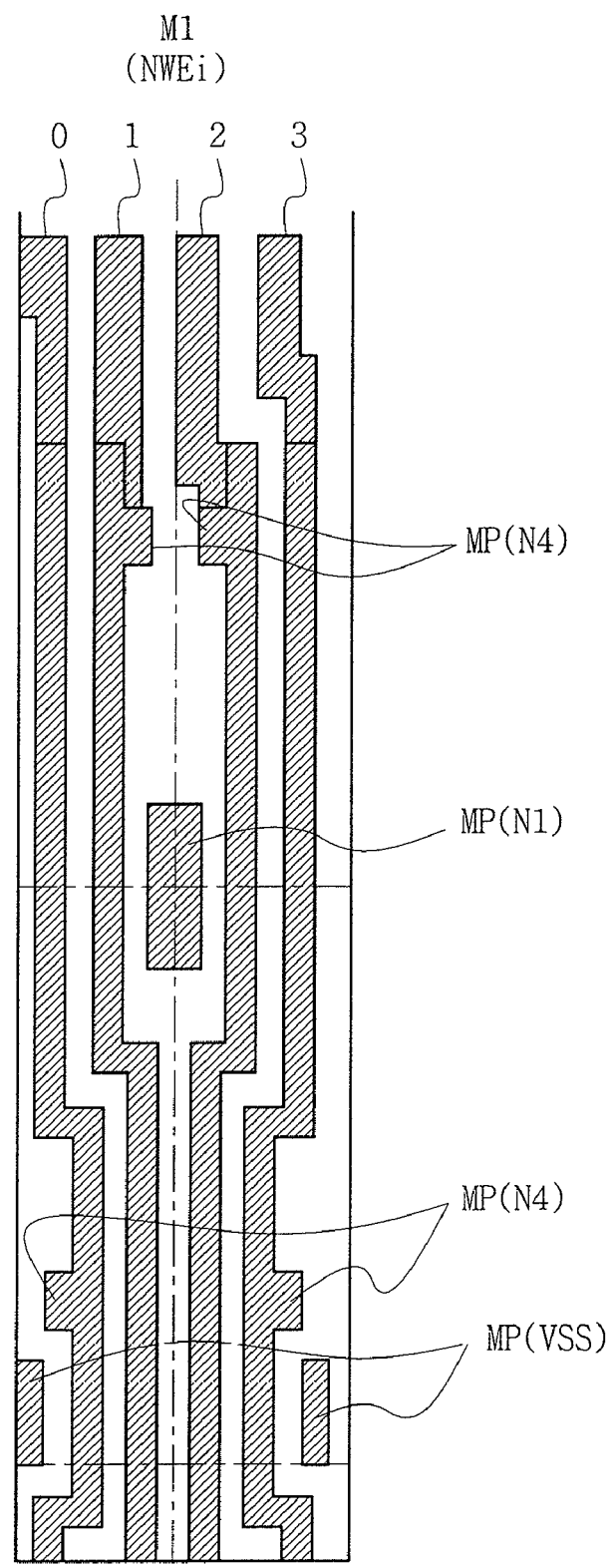
Figure 11G:
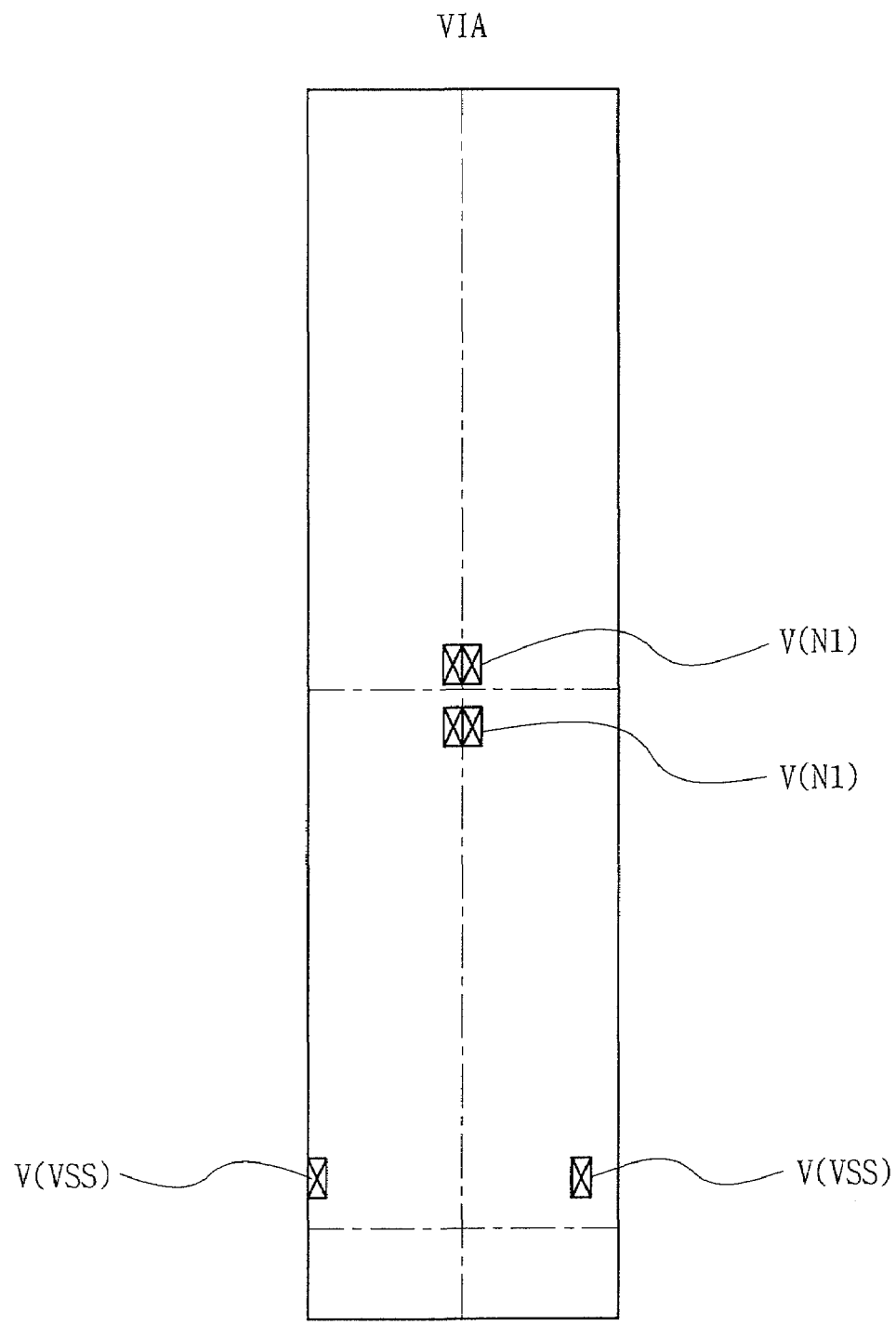
Figure 11H:
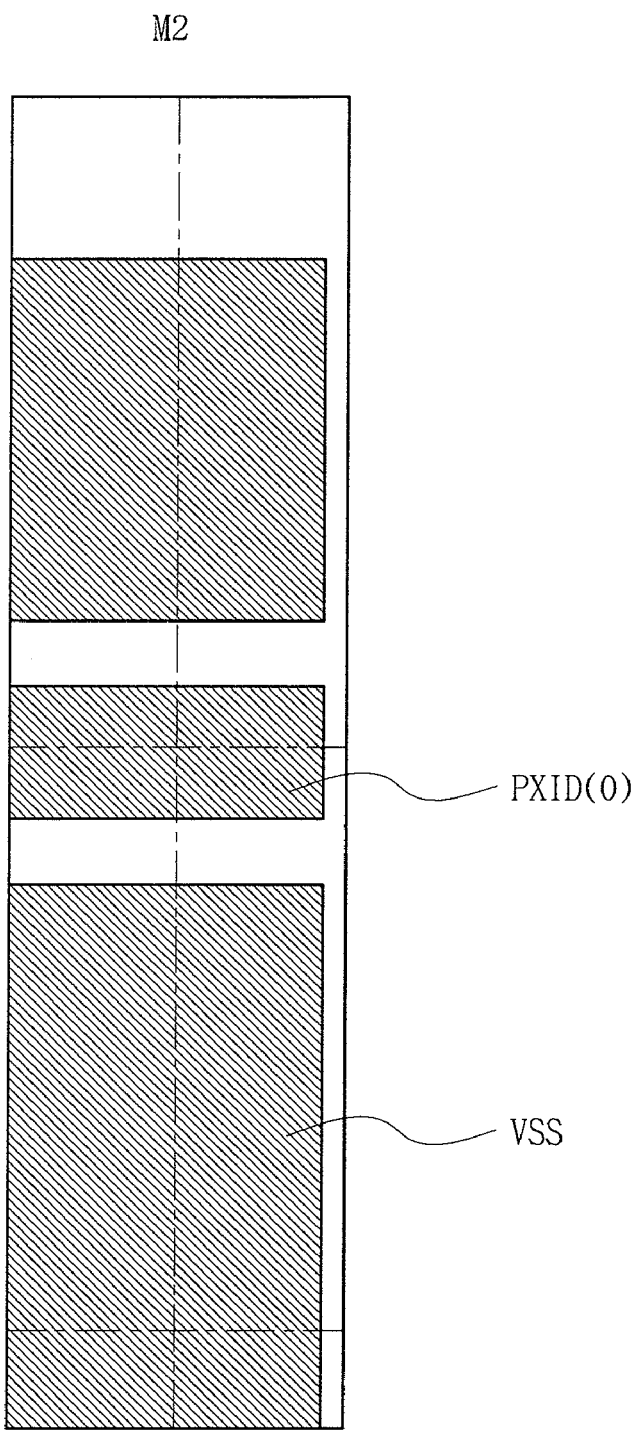

FIGS. 11A~11H schematically illustrate various levels of the FEOL circuitry and BEOL metallization patterns of the upper SWD regions R0, R4, R4', R8, R8' and R12 for SWD0, SWD4, SWD8, and SWD 12. FIG. 11A illustrates an exemplary layout structure of active regions formed on a semiconductor substrate. FIG. 11B illustrates a gate line polysilicon layer that is formed on the active substrate surface. FIG. 11C illustrates an exemplary pattern of interlevel contacts to diffusion regions (drain/source) of the transistors and to poly gate lines. FIG. 11D illustrates an exemplary polysilicon pattern comprising sub word lines (WL 0, 2, . . . , 14) that are formed over the active components extending as well as pads for interlevel connections. FIG. 11E schematically illustrates a metal interlevel contact layer that is formed over the polysilicon pattern providing via contacts to certain points of the poly silicon pattern of FIG. 11D. FIG. 11F schematically illustrates an exemplary metallic pattern (first level metallization) providing normal word line enable lines as well as contact pads. FIG. 11G schematically illustrates a pattern of via contacts providing interlevel connections between layers 11F and 11H. FIG. 11H schematically illustrates a second metal layer pattern formed over the via layer providing PXI control signal lines.

Referring to FIGS. 9, 10A/10B and 11A/11B, the transistors T1~T4 of each SWD circuit (0, 2, ~14) in FIG. 7 are formed by corresponding active regions A(T1, T3), A(T2) and A(T1, T3, T4) and gate lines G1, G2, G3 and G4. In particular, the transistors T1 and T3 for SWDs 2, 4, 8, 14 include separate active regions A(T1,T3) within respective regions R2, R4, R8 and R14 and common gate lines G1 and G3 that are formed over the active regions A(T1, T3) and which extend between regions R4 and R8 and between regions R2 and R14. The transistors T2 for SWDs 0, 4, 8 and 12 share a common active region A(T2) and have separate gate lines G2. Similarly, the transistors T2 for SWDs 2, 6, 10 and 14 share a common active region A(T2) and have separate gate lines G2.

The transistors T1, T3 and T4 for SWDs 0, 12 include separate active regions A(T1,T3, T4) and common gate lines G1, G3 and G4 that extend over the separate active regions A(T1, T3, T4). Similarly, the transistors T1, T3 and T4 for SWDs 6, 10 include active regions A(T1,T3, T4) and common gate lines G1, G3 and G4 that extend over the separate active regions.

The transistors T4 for SWDs 2, 4, 8, and 14 are formed in regions R2', R4', R8' and R14', respectively, separate from regions R2, R4, R8 and R14 in which transistors T1, T2 and T3 are formed. In particular, the transistors T4 for SWDs 2, 4, 8, 14 include separate active regions (T4) and common gate lines G4. The transistors T4 for SWDs 4, 8 include a common gate line G4 that extends over the separate active regions A(T4) in regions R4' and R8' and the transistors T4 for SWDs 2, 14 include a common gate line G4 that extends over the separate active regions A(T4) between regions R2' and R14'.

The transistors T2 of SWDs 0, 4, 8 and 12 share a common active region A(T2) in abutting regions R0, R4, R8 and R12, and have separate gate lines G2. The transistors T2 of SWDs 2, 6, 10 and 14 share a common active region A(T2) in adjacent regions R2, R6, R10 and R14 and have separate gate lines G2. As shown, the portions of the gate lines G2 of transistors T2 of SWD 0, 4, 8, 12 that overly the active region A(T2) are substantially L-shaped and form a mirror image pattern over the boundaries between regions R0, R4, R8 and R12. Similarly, the portions of the gate lines G2 of transistors T2 of SWD 2, 6, 10, 14 that overly the active region A(T2) are substantially L-shaped and form a mirror image pattern over the boundaries between regions R2, R6, R10 and R14. The L shaped gate patterns of G2 enable the channel width of the transistors T2 to be maximized, while minimizing the amount of space occupied by the gates G2 in the y-direction.

The exemplary active device layout pattern of the SWDs 0, 2, 4, 6, 8, 10, 12, 14 form a compact layout in which corresponding transistors from different SWD circuits share diffusion regions and/or gate lines with contacts to common control signals in order to minimize space. For instance, with reference to FIGS. 10A, 10B and 11C, the common gate line G1 for transistors T1 in regions R4 and R8 provides a common VPP input for SWDs 4 and 8. Similarly, the common gate line G1 for transistors T1 in regions R0-R12 provides a common VPP input for SWDs 0 and 12, The common gate line G1 for transistors T1 in regions R6 and R10 provides a common VPP input for SWDs 6 and 10, and the common gate line G1 for transistors T1 in regions R2 and R14 provides a common VPP input for SWDs 2 and 14.

Further, as shown in FIG. 10A, the common gate line G3 for transistors T3 in regions R4 and R8 provides a common PXiDG(0) input for SWDs 4 and 8, and the common gate line G3 for transistors T3 in regions R0 and R12 provides a common PXiDG(0) for SWDs 0 and 12. Similarly, as shown in FIG. 10B, the common gate line G3 for transistors T3 in regions R6 and R10 provides a common PXiDG(2) input for SWDs 6 and 10, and the common gate line G3 for transistors T3 in regions R2 and R14 provides a common PXiDG(2) input for SWDs 2 and 14.

The transistors T1 and T3 for each SWD (0, 2, 4, 6, 8, 10, 12, 14) share a common diffusion region (node N4) between gates G1 and G3 wherein a contact CN4 is formed. The contacts CN4 in regions R0 and R2 form part of the interconnections from the diffusion regions of transistor T1 and T3 at node N4 to the NWE(0) lines in upper metal layers. The contacts CN4 in regions R4 and R6 form part of the interconnections from the diffusion regions of transistor T1 and T3 at node N4 to the NWE(1) lines in upper metal layers. The contacts CN4 in regions R8 and R10 form part of the interconnections from the diffusion regions of transistor T1 and T3 at node N4 to the NWE(2) lines in upper metal layers, and the contacts CN4 in regions R12 and R14 form part of the interconnections from the diffusion regions of transistor T1 and T3 at node N4 to the NWE(3) lines in upper metal layers.

Further, as depicted in FIG. 10A, the common gate line G4 for transistors T4 in regions R4' and R8' provides a common PXiDB(0) input for SWDs 4 and 8, and the common gate line G4 for transistors T4 in regions R0 and R12 provides a common PXIDB(0) input for SWDs 0 and 12. This layout allows the transistors T4 of SWDs 0, 4, 8 and 12 to share a common diffusion region between the gate lines G4 providing a common ground VSS node having contacts CVSS. Similarly, as depicted in FIG. 10B, the common gate line G4 for transistors T4 in regions R2' and R14' provides a common PXiDB(2) input for SWDs 2 and 14, and the common gate line G4 for transistors T4 in regions R6 and R10 provides a common PXiDB(2) input for SWDs 6 and 10. This layout allows the transistors T4 of SWDs 2, 6, 10, and 14 to share a common diffusion region between the gate lines G4 providing a common ground VSS node with contact CVSS.

As depicted in FIG. 10A, the transistors T2 for SWDs 0, 4, 8, and 12 have gates G2 that share common diffusion regions (node N1) where a first contact CN1 is formed on a portion of the common active diffusion region between the gate lines G2 of transistors T2 of SWDs 4 and 8, and where a second contact CN1 is formed on a portion of the common active diffusion region between the gate lines G2 of transistors T2 of SWDs 0 and 12. The contacts CN1 are commonly connected to a PXiD(0) control signal line at upper level. As such, the SWDs 0, 4, 8 and 12 commonly share the PXiD(0) signal. Similarly, as depicted in FIG. 10B, the transistors T2 for SWDs 2, 6, 10, and 14 have gates G2 that share common diffusion regions (node N1) where a first contact CN1 is formed on a portion of the common active diffusion region between the gate lines G2 of transistors T2 of SWDs 2 and 14, and where a second contact CN1 is formed on a portion of the common active diffusion region between the gate lines G2 of transistors T2 of SWDs 6 and 10. Theses contacts CN1 are commonly connected to a PXiD(2) control signal line at upper level. As such, the SWDs 2, 6, 10 and 14 commonly share the PXiD(2) signal.

Moreover, as depicted in FIGS. 10A/10B and 11C, a plurality of contacts CN3 are formed in regions R0, R2, R4, R6, R8, R10, R12 and R14 which enable upper level connections between the gate G2 of the transistor T2 and diffusion region of transistor T1 in each SWD. In particular, in each SWD region, a pair of contacts CN3 contact are formed on the diffusion region of the transistor T1 next to the gate line G1 and formed on an extended portion of the gate line G2 of the transistor T2 that does not overlap any portion of the active region A(T2) and which is adjacent to the contact CN3 on diffusion region. As explained below, each pair of contacts CN3 is commonly connected at an upper level to providing a boosting node N3 connection between the gate of T2 and the source of T1 in each SWD circuit.

Moreover, as depicted in FIGS. 10A/10B and 11C, a plurality of contacts CN5 are formed at various points in each of the regions R0, R2, R2' R2', R4, R4' R6, R8, R8' R10, R12, R14 and R14' to provide connections (node N5) between drain/source diffusion regions of transistors T2, T3, and T4 of each SWD circuit to a corresponding subwordline in a poly layer pattern above the SWD regions.

In the SWD 4 circuit, two separate contacts CN5 are formed in region R4 at the diffusion regions of transistors T2 and T3 next to respective gate lines G2 and G3 and another contact CN5 is formed in region R4' at the diffusion region of transistor T4 next to the gate line G4.

FIG. 11D schematically illustrates a layout pattern of a portion of the subwordlines (WL 0, 2 . . . 14) that are formed over the contact layer of FIG. 11C in SWD regions R0, R4/R4', R8/R8' and R12. In FIG. 11D, the end portions of the upper level subwordlines WL (0, 2~14) in FIG. 11D are connected to the end portions of the lower level subwordlines (WL (0, 2~14) in FIG. 11B via respective contacts WC (0, 2, ~14) of FIG. 11C.

The contacts CN5 in regions R4/R4' provide connections between diffusion regions of transistors T2, T3 and T4 of SWD4 to contact points P(N5) along the sub wordline WL4 in the upper poly layer as shown in FIG. 11D. The contacts CN5 in region R0 provide connections between diffusion regions of transistors T2, T3 and T4 of SWD0 to contact points P(N5) along the sub wordline WL0 in the upper poly layer as shown in FIG. 11D. The contacts CN5 in regions R8/R8' provide connections between diffusion regions of transistors T2, T3 and T4 of SWD8 to contact points P(N5) along the sub wordline WL8 in the upper poly layer as shown in FIG. 11D. The contacts CN5 in region R12 provide connections between diffusion regions of transistors T2, T3 and T4 of SWD12 to contact points P(N5) along the sub wordline WL12 in the upper poly layer as shown in FIG. 11D. Although not specifically shown, the contacts CN % in the SWD regions R2/R2', R6, R10, and R14/R14' providing connections between the diffusion region of the transistors T2, T3, and T4 of each SWD 2, 6, 10 and 14 to contact points P(N5) along respective portions of sub wordlines WL2, 6, 10 and 14 extend in the upper poly layer above the SWD regions for SWDs 2, 6, 10 and 14.

As further depicted in FIG. 11D, the poly pattern includes isolated pad patterns PN1, PN3, PN4, and PVSS. In particular, the pad PN1 in the poly layer of FIG. 11D is connected to both contacts CN1 to provide a common connection between the drain diffusion regions of the transistors T2 for SWDs 0, 4, 8 and 12. The pad patterns PN3 in each region R0, R4, R8 and R12 provide a common connection between the contact pairs CN3 in each of the respective regions. The pad patterns PN4 provide contact pads for the diffusion region contacts CN4 that contact to common diffusion regions of transistors T1, T3 in each SWD region Ro, R4, R8 and R12. Moreover, the pads P(VSS) provide contact pads for the ground contacts CVSS that contact the common ground node diffusion region between the gate elements G4 of region R0/R12 and R4'/R8'.

FIG. 11E illustrates a next layer of metal contacts that are formed over the polysilicon layer of FIG. 11D providing interlevel connections to conductive lines and pads of a first metallization level of FIG. 11F. In particular, in FIG. 11E, a plurality of contacts MC(N1) are formed to provide interlevel contacts between the poly pad element PN1 in FIG. 11D to a metal pad element MP(N1) in FIG. 11F. The metal pad element MP(N1) is connected to a PXiD(0) control signal line formed on a second metallization level (FIG. 11H) by interlevel via contacts V(N1) as shown in FIG. 11G). As such, the control signal line PXiD(0) is commonly connected to each drain region of transistor T2 of SWDs 0, 4, 8 and 12).

FIG. 11F illustrates a layout pattern of portions of normal wordlines NWE (0, 1, 2, 3) that are formed over the poly wordline layer of FIG. 11D in SWD regions R0, R4/R4', R8/R8' and R12. The normal wordlines NWE0 and NWE1 extend in the y-direction over the stacked SWD regions R4/R0/R4'/R2'/R6/R2, and the normal wordlines NWE2 and NWE3 extend in the y-direction over the stacked SWD regions R8/R12/R8'/R14'/R10/R14. The interlevel contact layer of FIG. 11E includes metal contact MCN4 in regions RO, R4, R8 and R12 that connect the poly pad elements PN4 in FIG. 11D in respective regions to portions MP(N4) of the NWEs 0, 1, 2 and 3 in the metal layer of FIG. 11F. Although not specifically shown, portions of the NWEs 0, 1, 2, 3 that extend over the SWD regions 2, 6, 10 and 14 are connected to MCN4 and PN4 contacts in the regions R2, R6, R10 and R14.

In FIG. 11E, a plurality of contacts MC(VSS) are formed to provide interlevel contacts between the poly pad element P(VSS) in FIG. 11D to a metal pad element MP(VSS) in FIG. 11F. The metal pad element MP(VSS) is connected to a VSS signal line control signal line formed on the second metallization level (FIG. 11H) by interlevel via contacts V(VSS) as shown in FIG. 11G. As such, the VSS power line is commonly connected to the VSS node between transistors T4 of SWDs 0, 4, 8 and 12).

In FIG. 11E, a plurality of contacts MC(N1) are formed to provide interlevel contacts between poly pad element P(N1) in FIG. 11D to a metal pad element MP(N1) in FIG. 11F. The metal pad element MP(N1) is connected to a PXiD(0) control signal line formed on the second metallization level (FIG. 11H) by interlevel via contacts V(N1) as shown in FIG. 11G. As such, the PXiD(0) line is commonly connected to the diffusion contact nodes CN1 in FIG. 11C between the gates G2 of transistors T2 of SWDs 0, 4, 8 and 12).

While the present invention has been particularly shown and described with reference to exemplary embodiments thereof, it will be understood by those skilled in the art that various changes in form and details may be made therein without departing from the spirit and scope of the invention as defined by the appended claims.

We claim:

1. A semiconductor memory device, comprising:
a block of sub-word line driver circuits (SWDB) disposed between a first block of memory and a second block of memory,
wherein the SWDB comprises a plurality of sub-wordline driver (SWD) circuits arranged in a plurality of SWD columns each comprising four SWD circuits extending in a first direction between the first and second blocks of memory,
wherein two adjacent SWD columns comprises a SWD group for driving sub-word lines extending from the SWD group along the first direction into the first block of memory and for driving sub-word lines extending from the SWD group along the first direction into the second block of memory,
wherein each of a first pair of SWD circuits in a first SWD column of the two adjacent columns and each of a first pair of SWD circuits in a second SWD column of the two adjacent columns share first common word line activation control signals, and
wherein each of a second pair of SWD circuits in the first SWD column of the two adjacent columns and each of a second pair of SWD circuits in the second column of the two adjacent columns share second common word line activation signals.

2. The semiconductor memory device of claim 1, wherein each SWD group drives even sub-wordlines extending into the first and second blocks of memory.

3. The semiconductor memory device of claim 1, wherein each SWD group drives odd sub-wordlines extending into the first and second blocks of memory.

4. The semiconductor memory device of claim 1, wherein each SWD circuit comprises a first transistor, a second transistor, a third transistor and a fourth transistor, wherein the first transistor of at least four SWD circuits of a given SWD group are arranged adjacent to each other and share an active region.

5. The semiconductor memory device of claim 4, wherein the first transistors have control gate electrodes that are substantially L-shaped.

6. The semiconductor device of claim 4, wherein the second transistor of at least four SWD circuits of a given SWD group are arranged adjacent to each other and share and a ground node.

7. The semiconductor device of claim 6, wherein the second transistors are arranged in a central region of the SWDB between the first and second memory blocks.

8. The semiconductor device of claim 1, wherein four sub wordlines and two normal word lines are formed on upper layers over each SWD column extending in a direction of the SWD column.

9. The semiconductor device of claim 1, wherein the semiconductor device is a DRAM.

10. A semiconductor DRAM (dynamic random access memory) device, comprising:
a plurality of separately controlled memory banks, wherein each memory bank comprises:
a matrix of separate memory blocks extending in column and row directions over the memory bank;
a block of row decoder circuits disposed along one side of the memory bank,
a set of n normal wordlines extending from each block of row decoder circuits along each row of memory blocks of the memory bank;
a block of sub-word line driver circuits (SWDB) disposed between each memory block in row direction of the memory bank and connected to each set of n normal wordlines extending along the given row of memory blocks,
wherein each SWDB comprises a plurality of sub-wordline driver (SWD) circuits arranged in a plurality of SWD columns each comprising four SWD circuits extending in a first direction between the first and second blocks of memory,
wherein two adjacent SWD columns comprises a SWD group for driving sub-word lines extending from the SWD group along the first direction into the first block of memory and for driving sub-word lines extending from the SWD group along the first direction into the second block of memory,
wherein each of a first pair of SWD circuits in a first SWD column of the two adjacent columns and each of a first pair of SWD circuits in a second SWD column of the two adjacent columns share first common word line activation control signals, and
wherein each of a second pair of SWD circuits in the first SWD column of the two adjacent columns and each of a second pair of SWD circuits in the second column of the two adjacent columns share second common word line activation signals.

11. The semiconductor memory device of claim 10, wherein each SWD group drives even sub-wordlines extending into first and second memory blocks on each side of the SWD group in the row direction.

12. The semiconductor memory device of claim 10, wherein each SWD group drives odd sub-wordlines extending into first and second memory blocks on each side of the SWD group in the row direction.

13. The semiconductor memory device of claim 10, wherein each SWD circuit comprises a first transistor, a second transistor, a third transistor and a fourth transistor, wherein the first transistor of at least four SWD circuits of a given SWD group are arranged adjacent to each other and share an active region.

14. The semiconductor memory device of claim 13, wherein the first transistors have control gate electrodes that are substantially L-shaped.

15. The semiconductor device of claim 13, wherein the second transistor of at least four SWD circuits of a given SWD group are arranged adjacent to each other and share and a ground node.

16. The semiconductor device of claim 15, wherein the second transistors are arranged in a central region of the SWDB between the first and second memory blocks.

17. The semiconductor device of claim 10, wherein four sub wordlines and two normal word lines are formed on upper layers over each SWD column extending in a direction of the SWD column.

* * * * *